(12) United States Patent
Abadeer

(10) Patent No.: US 7,692,130 B2
(45) Date of Patent: Apr. 6, 2010

(54) CMOS IMAGING SENSOR HAVING A THIRD FET DEVICE WITH A GATE TERMINAL COUPLED TO A SECOND DIFFUSION REGION OF A FIRST FET DEVICE AND A FIRST TERMINAL COUPLED TO A ROW SELECT SIGNAL

(75) Inventor: Wagdi W. Abadeer, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 610 days.

(21) Appl. No.: 11/555,331

(22) Filed: Nov. 1, 2006

(65) Prior Publication Data

US 2008/0099805 A1    May 1, 2008

(51) Int. Cl.
*H01L 27/00*    (2006.01)
(52) U.S. Cl. .................. 250/208.1; 250/214 R
(58) Field of Classification Search ............. 250/208.1, 250/214 R, 205; 348/302–308, 297–298; 257/290–293, 440, 436
See application file for complete search history.

(56) References Cited

U.S. PATENT DOCUMENTS

| 6,882,367 | B1 | 4/2005 | Merrill et al. |
| 7,046,284 | B2 | 5/2006 | Kozlowski et al. |
| 7,102,180 | B2 | 9/2006 | Rhodes et al. |
| 7,514,716 | B2 * | 4/2009 | Panicacci ..................... 257/72 |
| 2002/0001038 | A1 | 1/2002 | Lee |
| 2003/0169359 | A1 | 9/2003 | Merrill et al. |
| 2004/0065808 | A1 | 4/2004 | Kochi et al. |
| 2004/0069930 | A1 | 4/2004 | Zarnowski et al. |
| 2004/0080648 | A1 | 4/2004 | Rhodes |
| 2005/0036050 | A1 | 2/2005 | Ueno et al. |
| 2006/0065811 | A1 | 3/2006 | Yoon et al. |
| 2006/0192263 | A1 | 8/2006 | Inagaki et al. |
| 2006/0203111 | A1 | 9/2006 | Hynecek |

OTHER PUBLICATIONS

ISR/WO, May 6, 2008.

* cited by examiner

*Primary Examiner*—Que T Le
(74) *Attorney, Agent, or Firm*—Scully, Scott, Murphy & Presser, P.C.; Anthony J. Canale

(57) ABSTRACT

A CMOS image sensor and active pixel cell design that provides an output signal representing an incident illumination light level that is adapted for time domain analysis. Thus, the noise sources associated with charge integration and the contribution of dark current to it, is avoided. The active pixel cell design implements only three FETs: a transfer device, a reset device and an output transistor device having one diffusion connected to a Row Select signal. In this mode of operation, use is made of the voltage decay at the photo diode to generate a pixel output at one diffusion of the output transistor device, which is a pulse with fixed amplitude independent of the incident illumination level. For use of an NFET output transistor device, the pulse width is an inverse function of the incident illumination level. For a PFET output transistor device, the output pulse has a time delay, from a reference signal, by an amount that is an inverse function of the incident illumination level.

39 Claims, 18 Drawing Sheets

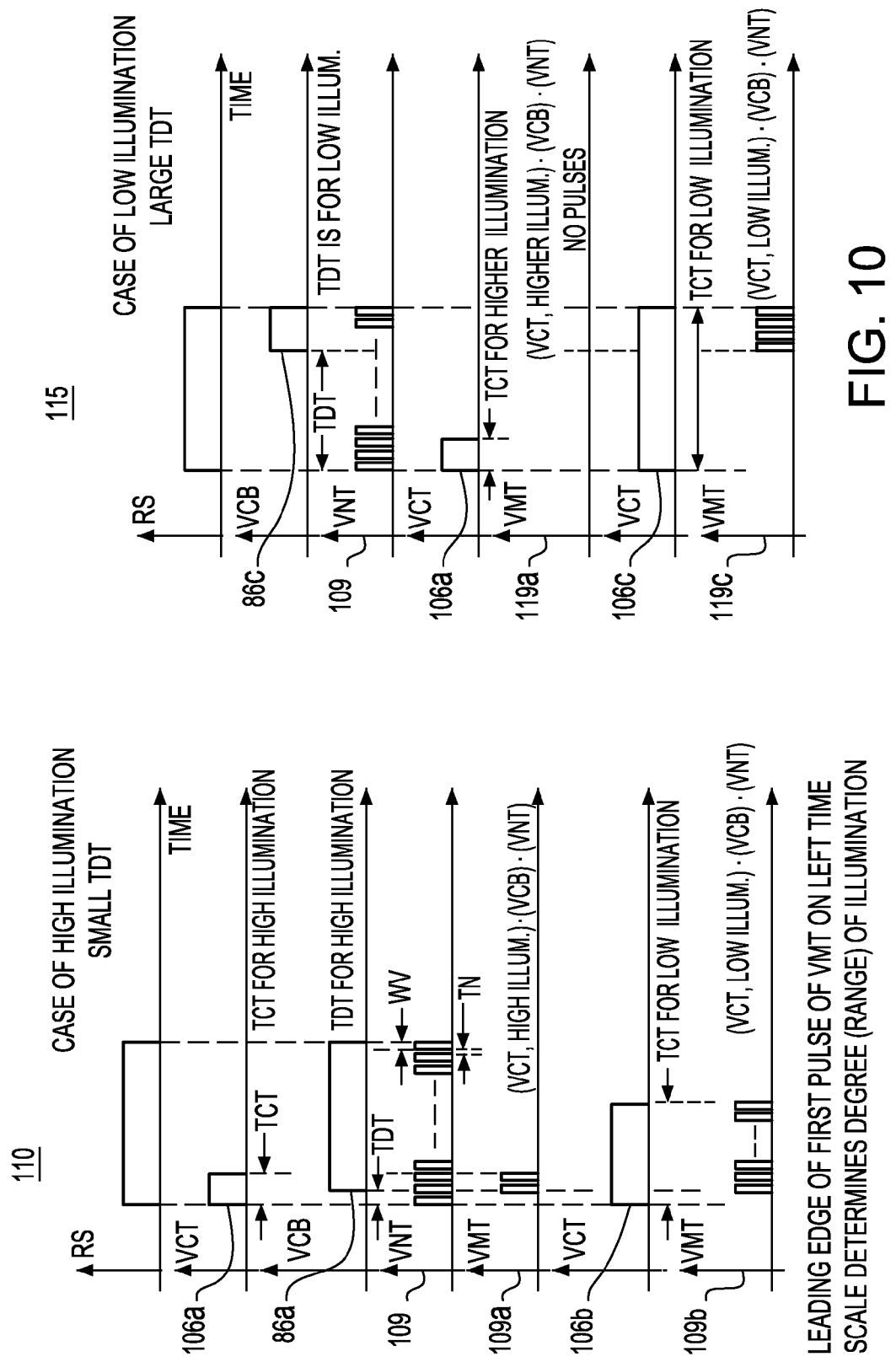

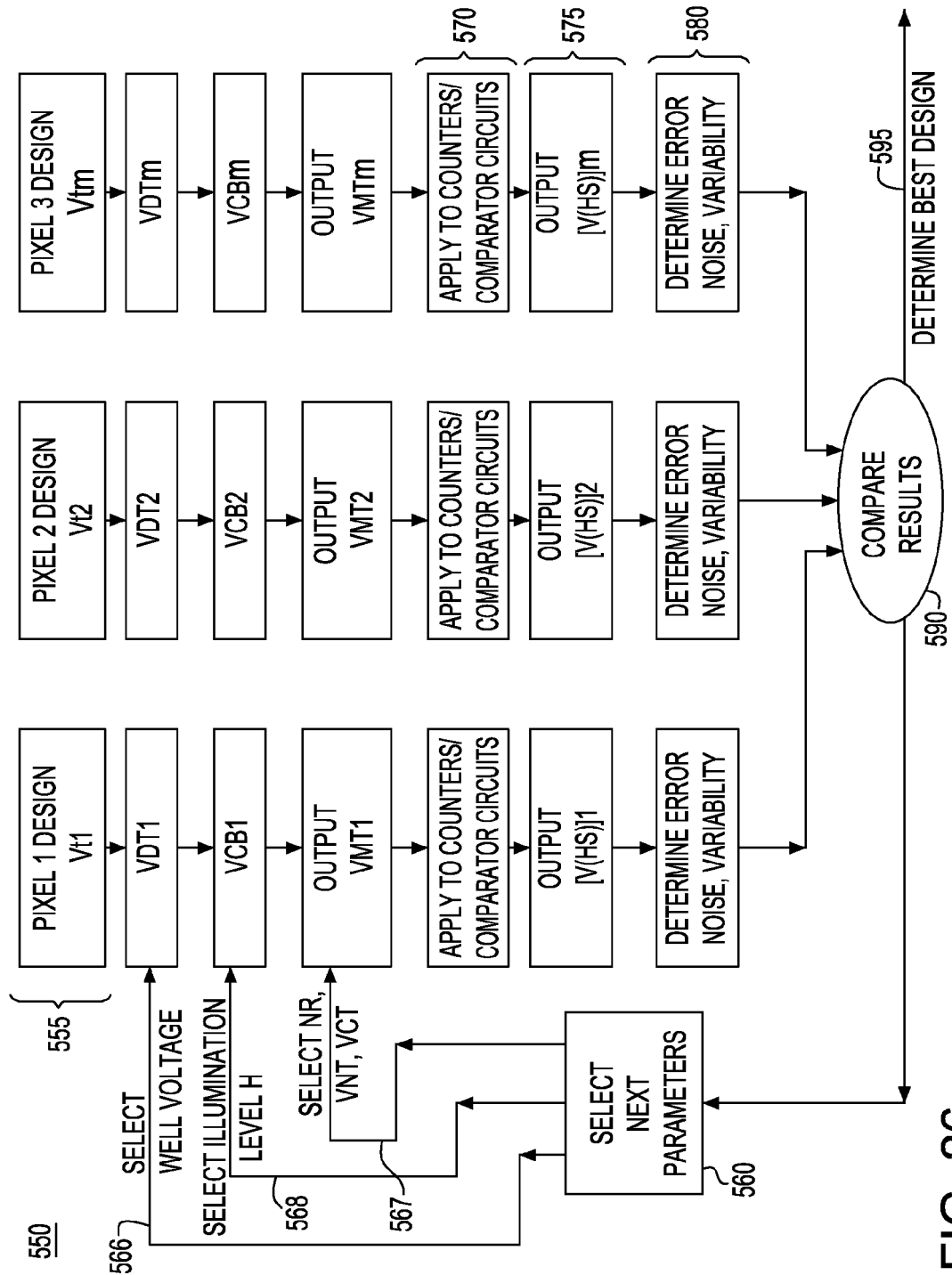

CMOS IMAGING SENSOR HAVING A THIRD FET DEVICE WITH A GATE TERMINAL COUPLED TO A SECOND DIFFUSION REGION OF A FIRST FET DEVICE AND A FIRST TERMINAL COUPLED TO A ROW SELECT SIGNAL

FIELD OF THE INVENTION

The present invention related generally to pixel image sensors such as manufactured by CMOS semiconductor manufacturing techniques, and, particularly to a novel image sensor that operates under a completely different operating mode from charge integration that is typically employed with conventional CMOS image sensors.

DESCRIPTION OF THE PRIOR ART

An image sensor produces images by employing the characteristics of a Semiconductor material, converting incident photons to electric charge. An image sensor detecting light can generally be classified as either a charge coupled device (CCD) image sensor, and a CMOS image sensor. As compared to CCD image sensors, CMOS image sensors have the advantage of low power consumption and ease of large scale integration of electronics on the same chip. With CMOS image sensors, the pixel array which converts incident photons to electric charge, and the peripheral circuitry with digital and analog type devices are manufactured in the same MOS manufacturing processes, thus it is easier to integrate the pixel array with the peripheral circuitry. With the wide spread use of CMOS imaging sensor, it should be noted that, generally, CCD image sensors have been regarded with better image quality than CMOS image sensors. The reason for that is the noise sources associated with CMOS image sensors, which range from: reset noise, thermal noise, 1/f flicker noise, dark current and shot noise, quantization noise, photon shot noise, dark fixed-pattern noise, Light fixed-pattern noise (PRNU), and defect pixels.

To understand the operation of a CMOS pixel and how the major sources of noise are introduced, FIG. 1 illustrates a typical four (4) device pixel design 10 implementing NFET devices. This design is usually referred to in literature as a 4 device Active Pixel Sensor (APS). The pixel device 10 consists of a first transfer device 13 with TG (transfer) gate, whose one diffusion is the photo diode 15 which collects the incident light, and the other diffusion of the transfer device 13 is referred to as the floating diffusion 20. The floating diffusion 20 is connected to the source 25 of a Reset device 23 with RG (reset) gate, and the drain 30 of the reset device is connected to Vdd which also serves as the reset voltage. Note that sometimes the drain of the transfer device is connected to a separate reference voltage Vref, different from Vdd, and serves as the reset voltage.

The voltage of the reset gate RG is commonly 5V and it should be at least one threshold voltage higher than the reset voltage Vdd. The source 20 of the transfer device 13 is also connected to the gate of N-channel MOS readout transistor SF 33. The drain 35 of the readout device SF is connected to Vdd and the source 40 of NFET SF is connected to the drain of N-channel MOS transistor row select device 43, whose gate is connected to a Row Select line 46. The source of the row select NFET 43 is connected to a column output line 47.

The operation of the prior art pixel arrangement shown in FIG. 1 is as follows: when both the transfer device gate TG and the reset device gate RG are high, the reset voltage is transferred to the photo diffusion. Next the reset device is turned OFF, and with incident light on the photo diffusion, there is photo current generated by the charge formation at the photo diode 15. With the transfer device gate TG is High (e.g., logic 1 voltage applied), there is a charge integration period formed by the photo current and the device capacitance at the gate of the readout NFET SF device 33. The transfer device TG is turned OFF (e.g., logic 0 voltage applied) to isolate the gate of the readout NFET SF from further collection of photo charge by the photo diode 15, when a charge integration period has ended.

As pointed out, the operation of the CMOS image sensor 10 with the charge integration mode suffers from a variety of noise sources that limit its performance as compared with CCD devices. There has been progress with reducing or eliminating at least some of the noise sources. For example, Correlated double sampling [1] can be used effectively to significantly reduce reset noise. Also [2]-[7] there has been significant progress made in enhancing the performance of the image sensor and reducing the size or number of devices required for the CMOS pixel. There is still problems with areas such as dark current and its fixed pattern noise.

It would be highly desirable to provide a CMOS image sensor design and method of operation that is different from charge integration which has been used with conventional CMOS image sensors. In this manner, the noise sources associated with charge integration and the contribution of dark current to it, can be avoided.

SUMMARY OF THE INVENTION

In this invention the CMOS image sensor and APS cell design that operates according to a mode different from charge integration which has been used with conventional CMOS image sensors. Thus the noise sources associated with charge integration and the contribution of dark current to it, can be avoided.

In the APS cell of the invention, there are only three FETs implemented: a transfer device, a reset device and an output transistor device which has one diffusion connected to a Row Select signal. Instead of the conventional charge integration mode in a conventional APS, the APS cell of the invention employs a mode of using the voltage decay at the photo diode to generate a pixel output, at one diffusion of the output transistor device, which is a pulse with fixed amplitude independent of the incident illumination level. For use of an NFET output transistor device, the pulse width is an inverse function of the incident illumination level. For a PFET output transistor device, the output pulse has a time delay, from a reference signal, by an amount that is an inverse function of the incident illumination level.

In a pixel array having APS cells designed in accordance with the present invention, each row of pixels is processed one a time where all the pixels in a row process the output pulses, at their output devices at the same time. When a row in the pixel array is selected, all output pulses from the pixels in that row are processed, simultaneously through digital and analog circuits in the image sensor, outside the pixel array, and with employing internally generated signals, to generate a sequence of pulses. The number of pulses, at the output of the analog and digital circuits, is directly related to the incident illumination level at the photo diode of the pixel.

As the present invention does not employ conventional charge integration, there is no charge integration period, and the information contained in the pixel output is adapted for analysis in the time domain, i.e., either output pulse width or output pulse delay from a reference signal. Thus, for reading pixels by rows, there are digital and analog processing circuits associated with each individual column of pixels. The output of these analog and digital circuits is a number of pulses in relation to the incident illumination level. The output signal is proportional to the number of pulses. With this arrangement, all pixels in a row can be read simultaneously, similar to what is done on conventional APS with charge integration. However, the difference is that according to the present invention, the digital and analog processing circuits are added to each column.

The design of the image sensor, according to the present invention, employs tradeoff between two major factors: The first factor is the processing time for signals from each row of pixels, and this affects the number of rows in the image sensor. The second factor is the area needed to accommodate all the analog and digital circuits associated with each column, and this affects the number of columns in the image sensor.

Thus, in accordance with one aspect of the present invention, there is provided a CMOS imaging sensor cell, comprising:

a first FET device adapted to transfer a voltage from a first diffusion region to a second diffusion region, the transferred voltage representing an incident illumination level for a pixel of the sensor cell;

a second FET device configured as a reset switch, a first terminal of the second FET device coupled to the second diffusion region of the first FET; and a third FET device having a gate terminal coupled to the second diffusion region of the first FET for receiving the transferred voltage, a first terminal of the third FET coupled to a row select (RS) signal and a second terminal of the third FET coupled to a column signal line, wherein an output signal corresponding to the transferred voltage is generated for output at the column signal line in response to an applied row select signal.

Further to this aspect of the invention, for the sensor cell, the voltage at the gate terminal of the third FET device is a decreasing function with time with a rate of voltage decay being a function of the incident illumination level at the pixel.

Furthermore, according to one aspect of the invention, the voltage at the second terminal of the third FET device, coupled to the column signal line, is delayed in time with respect to the application of the RS signal at the first terminal of the third FET device by a time duration which is a function of the incident illumination level and a threshold voltage of the third FET device.

Further, in accordance with this aspect of the invention, the sensor cell further comprises a means for generating a sequence of voltage pulses corresponding to the output signal generated for output at the column signal line, the sequence of voltage pulses being adapted for time domain measurement.

Further, in accordance with this aspect of the invention, the illumination level incident at a pixel cell is divided into one or more detectable individual illumination ranges (NR), with each individual illumination range (R) having a minimum and maximum pulse sequence number value corresponding to a respective minimum and maximum illumination level for each range, wherein the means for generating a sequence of voltage pulses includes a means associated with a respective individual illumination range for generating none or more output pulses (VMT) providing information about the incident illumination level in a respective illumination range of the imaging sensor. It is noted that, in this aspect of the invention, a pulse counter means associated with each illumination range (R) for counting output pulses (VMT) at each range, is provided; and, a processing device is provided for determining the correct range for illumination and providing an illumination level output signal that is proportional to the light illumination incident at the pixel.

In one embodiment, for the sensor cell of the present invention, the first, second and third FET devices are nFET devices, at least one nFET comprises a triple N-well structure formed in a substrate.

In an alternate embodiment, for the sensor cell of the present invention, the first and second FET devices are nFET devices and the third FET device is a pFET device.

In a further aspect of the present invention, for each of the first and alternate embodiments of the pixel sensor cell, a methodology for operating the pixel cell structure and operating an array of pixels having the novel pixel design according to the present invention is provided.

Furthermore, a pixel sensor design methodology for optimizing the pixel cell structure according to power consumption, performance efficiency and detection accuracy, and chip real-estate for the novel pixel design structures according to the present invention, is provided.

Advantageously, the present invention exhibits decreased sensitivity to dark current.

BRIEF SUMMARY OF THE DRAWINGS

These and other objects, features and advantages of the present invention will become apparent from the following detailed description of illustrative embodiments thereof, which is to be read in connection with the accompanying drawings, in which:

FIG. 9 depicts an exemplary signal timing diagram 110 showing the signals generated for the example instance of pixel cell operation at high incident illumination level;

FIG. 10 depicts an exemplary signal timing diagram 115 showing the signals generated for the example instance of pixel cell operation at low incident illumination level;

DETAILED DESCRIPTION OF THE PREFERRED EMBODIMENTS

Figure 2A:
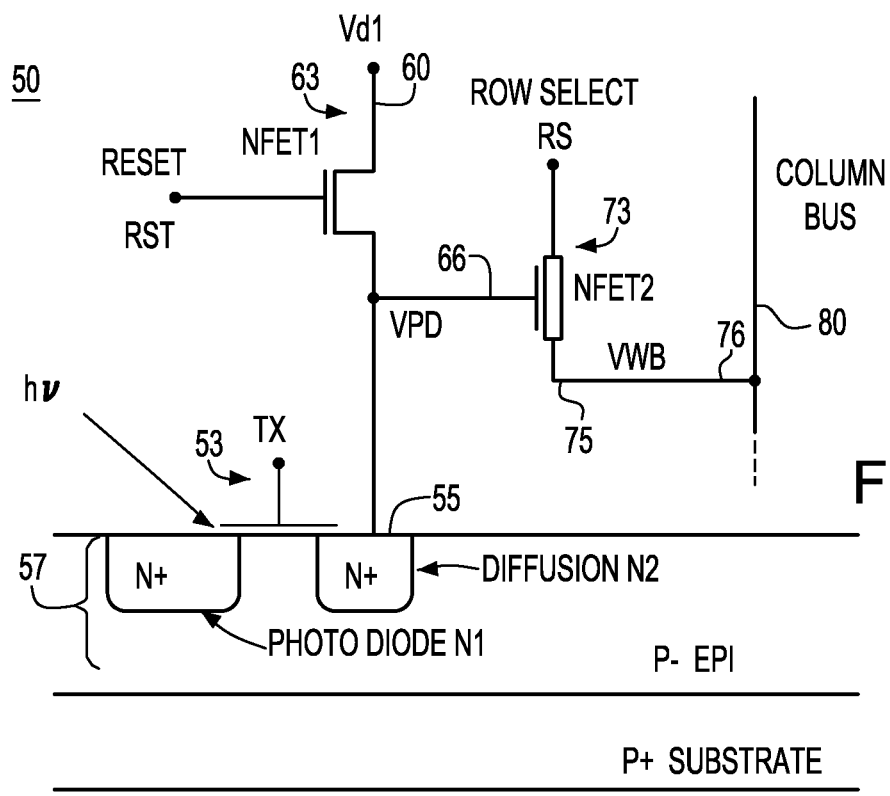
FIG. 2A depicts the novel pixel design 50 according to one embodiment of the invention using three (3) NFET devices.

FIG. 2A depicts the pixel design 50 according to one embodiment of the invention using a single NFET device for the output transistor NFET2. The pixel includes a transfer device TX 53, a reset device NFET1 63, and an output device NFET2 73. One diffusion of the TX device is the photo diode which will have incident light on it from the micro lens and filter (not shown) directly above it on top of the final passivation. In FIG. 2A, the RESET transistor is NFET1 63 with its gate as the reset voltage signal RST, one diffusion is connected to a diffusion 55 of the TX transfer device 53, and the other diffusion 60 is connected to the DC reset voltage Vd1. With RST and TX are high, the reset voltage Vd1 is transferred to the photo diode diffusion N1. When RST is low, TX is high, the photo diode voltage decays as a function of time and is transferred to diffusion N2 55 where it appears as voltage VPD 66.

Figure 2B:
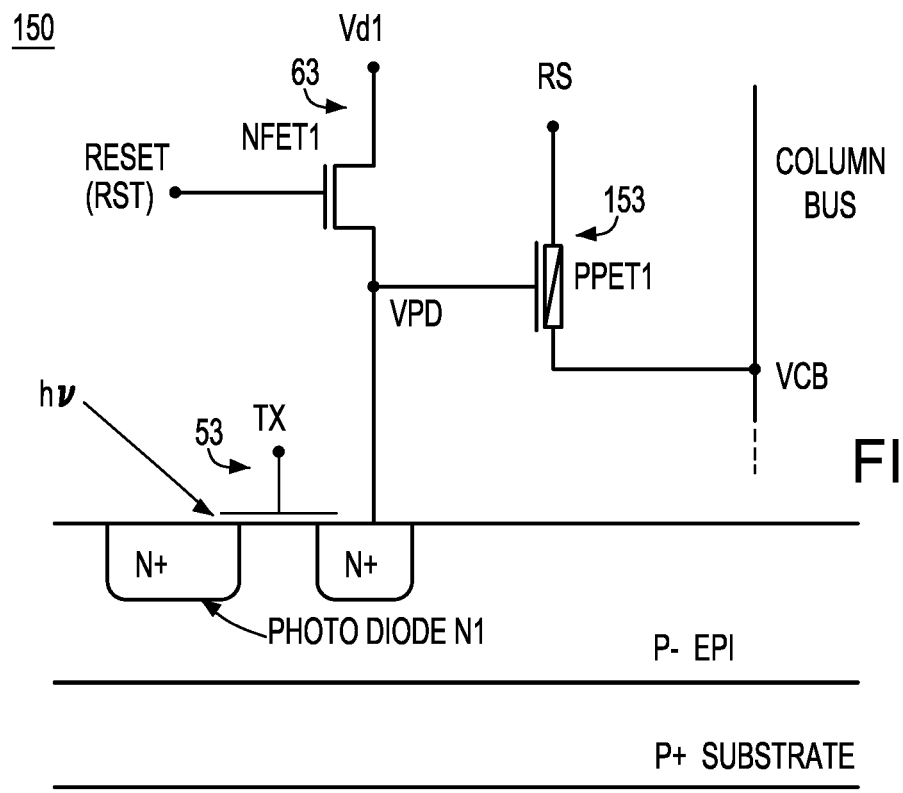
FIG. 2B depicts the novel pixel design 150 according to a second embodiment of the invention using three (3) transistor devices with a PFET transistor replacing the output NFET transistor device as in the first embodiment of FIG. 2A.
Figure 3:
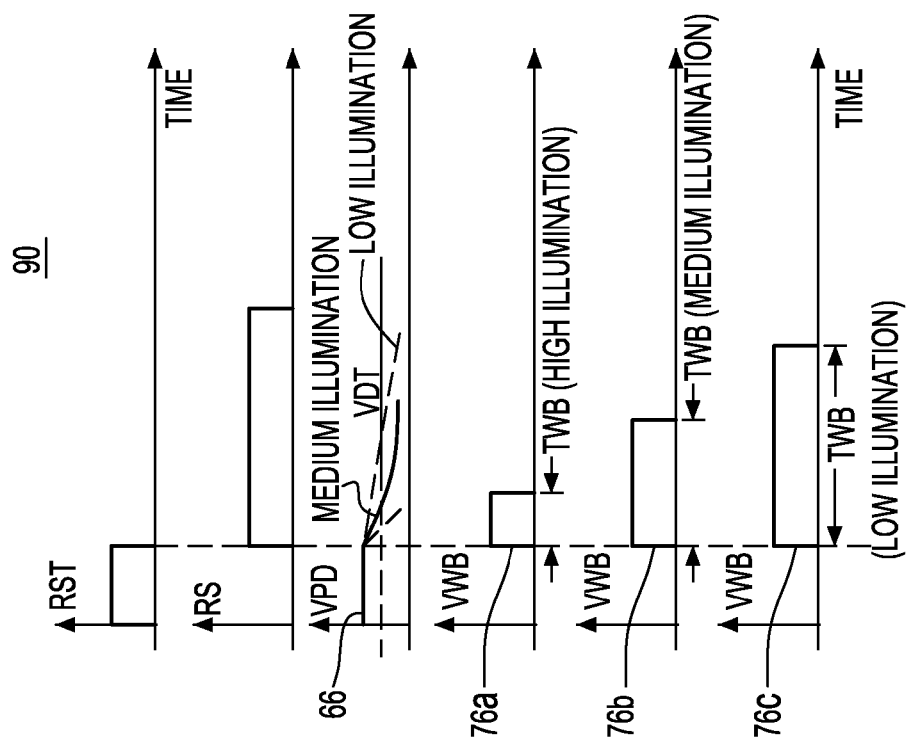
FIG. 3 depicts a signal timing diagram 90 depicting the operation of the novel pixel sensor cell 50 according to the embodiment depicted in FIG. 2A.

FIG. 3 depicts a signal timing diagram depicting the operation of the novel pixel sensor cell 50 according to the embodiment depicted in FIG. 2. As shown in FIG. 3, when RST signal goes low and the voltage VPD 66 decays with time, the RS signal connected to a diffusion of transistor NFET2 goes high. When VPD falls below the detect level VDT, which is equal to the threshold voltage of NFET2 73, the transistor NFET2 73 is turned OFF. The voltage VWB voltage level 76 of the other diffusion region 75 of NFET2 is as shown in FIG. 3 and is coupled to the column bus output 80. The fall of the voltage VPD 66 is a function of the illumination level. The higher the illumination level, the faster the drop of VPD 66 with time. Correspondingly, the width TWB of the signal VWB is a function of the illumination level. Thus, as shown in FIG. 3, the TWB width is shown for VWB signals 76a, 76b and 76c at three potential illumination levels, high illumination, medium illumination, and low illumination, respectively.

The decay of the photo diode voltage with time, V(t), is described below $$C(V) \times dV(t)/dt = -(Igr+IP) \quad (1)$$

where Igr is the generation-recombination current associated with the depletion layer of the photodiode device 57, and IP is the photo current. The operation is demonstrated using a graded junction, where the approximate junction capacitance C(V) is given by:

$$C(V) = APD \times (Q \times a \times \in_{SI}^2/12)^{1/3} \times V(t)^{-1/3} \quad (2)$$

where APD is the area of the photo diode N1 57; Q is the electron charge which is $1.6021 \times 10^{-19}$ Coulomb; a is the net doping gradient at the junction of N1, and $\in_{SI}$ is the permittivity of silicon which is $1.0536 \times 10^{-10}$ Farad/m. The current Igr is given by:

$$Igr = [APD \times Q \times NI/(2 \times \tau)] \times W \quad (3)$$

Where NI is the intrinsic carrier concentration which is equal to $1.6 \times 10^{16}$/m3 at room temperature of 27° C., τ is the effective lifetime in the space-charge region, and W is the space-charge width, which is given by:

$$W = [12 \times \in_{SI}/(Q \times a)]^{1/3} \times V(t) \quad (4)$$

The photo current IP is given by:

$$IP = I \times APD \times H \quad (5)$$

Where I is the photosensitivity for the p-n structure, and H is the illumination level in ft.cd. In an example device, for demonstration purposes, the following values may be assigned: τ=1.6 μsec., a=3×1029 m$^{-4}$, I=0.05 A/m².fc, and APD=10 mil²=6.25×10$^{-10}$ m².

Substituting with equations (2), (3), (4), and (5), into equation (1) yields the following differential equation:

$$\{V(t)^{-2/3} \times [dV(t)/dt]\} + \{I \times H \times [12/(Q \times a \times \in_{SI})^{1/3}] \times V(t)^{-1/3}\} + \{[NI/(2 \times \tau)] \times [144 \times Q/(a^2 \times \in_{SI})^{1/3}]\} = 0 \quad (6)$$

Figure 5:
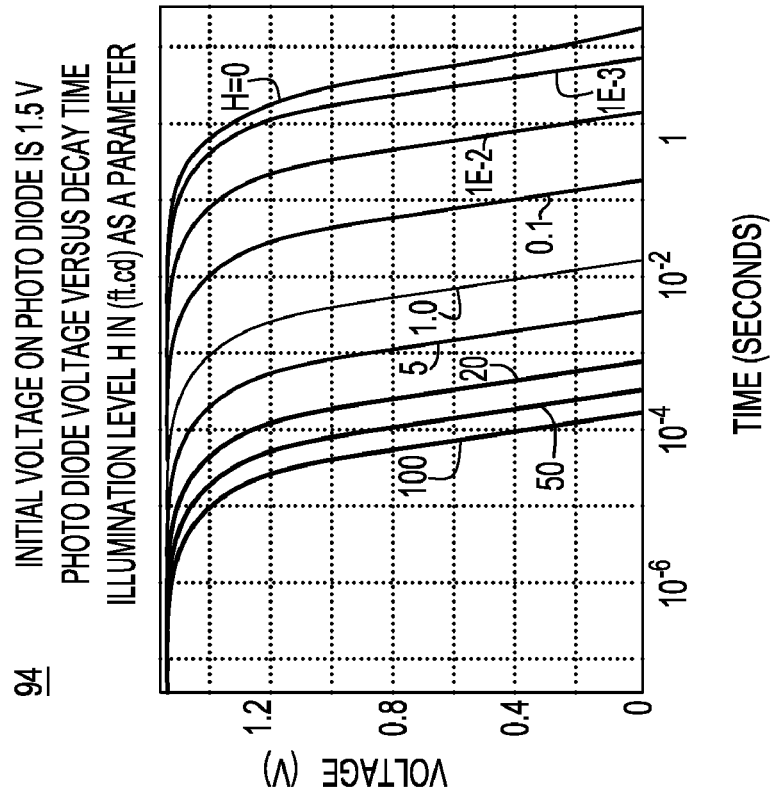
FIG. 5 depicts the photovoltage-decay time plot 94 at different illumination levels for the case where the initial voltage Vd1 across N1 is 1.5 V.
Figure 4:
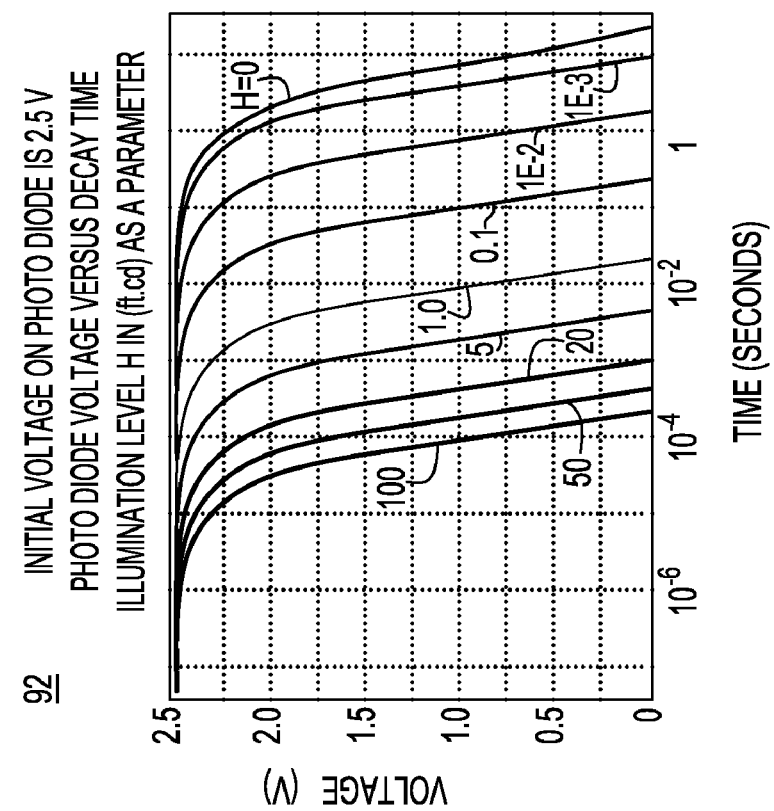
FIG. 4 depicts the photovoltage-decay time plot 92 at different illumination levels for the case where the initial voltage Vd1 across N1 is 2.5 V.

An explicit solution for equation (6) does not exist, but the equation is best solved by numerical techniques where the voltage V(t) is incremented in steps and the corresponding time interval is calculated. FIGS. 4 and 5 show the solution of equation (6) for the voltage V(t) across the photo diode N1 57 as function of time with the illumination level H as parameter. In FIG. 4, there is depicted the photovoltage-decay time plot 92 at different illumination levels for the case where the initial voltage Vd1 across N1 is 2.5 V; likewise, FIG. 5, there is depicted the photovoltage-decay time plot 94 at different illumination levels for the case where the initial voltage Vd1 across N1 is 1.5 V.

Figure 7:
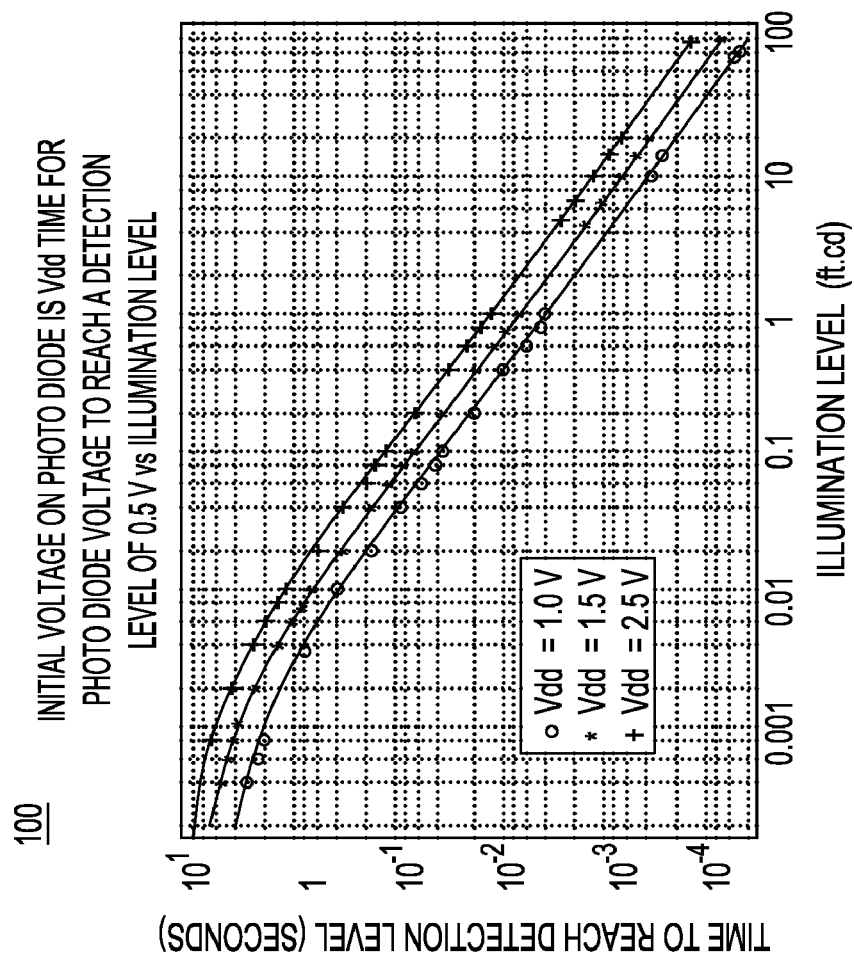
FIG. 7 is a plot 100 depicting the time (TDT) for the photo diode voltage VPD 66 to reach the detection level, versus illumination level, for different values of initial voltage.
Figure 6:
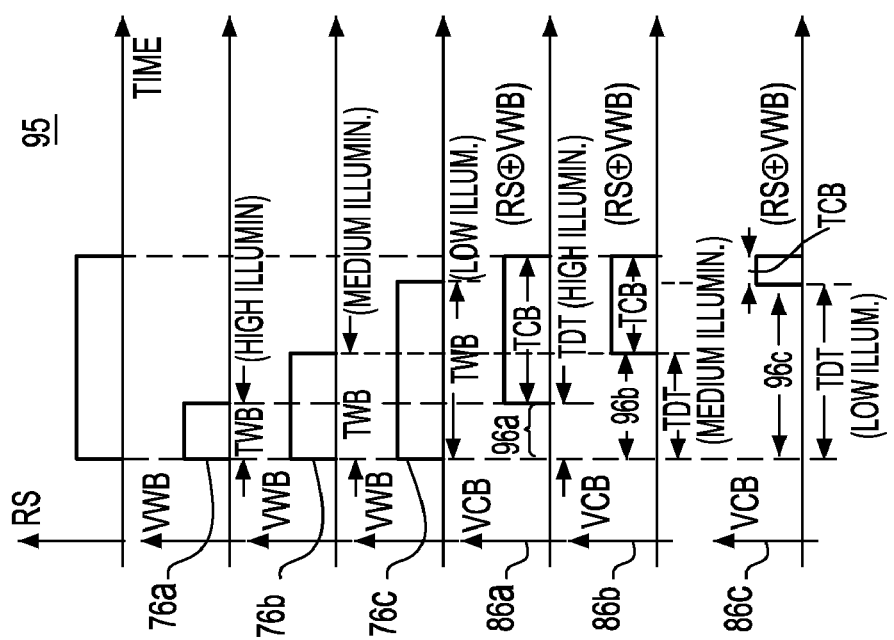
FIG. 6 depicts a signal timing diagram 95 of the respective signals VCB 86a, 86b, 86c generated as a result of an applied Exclusive OR (XOR) function between the signals RS and each of the respective VWB signals 76a, 76b, 76c such as shown in FIG. 3.

FIG. 6 depicts a signal timing diagram 95 of the respective signals VCB 86a, 86b, 86c that are generated as a result of an applied Exclusive OR (XOR) function between the signals RS and each of the respective VWB signals 76a, 76b, 76c such as shown in FIG. 3. The respective delay times TDT, depicted in FIG. 6 as TDT 96a, 96b, and 96c corresponding to the resulting signals VCB 86a, 86b, 86c, respectively, are a function of the illumination level. That is, the higher the illumination level, the smaller the delay time TDT. Additionally, the width TCB of each signal VCB 86a, 86b, 86c, is modulated by the illumination level. That is, the higher the illumination level, the larger the width TCB of signal VCB. FIG. 7 is a plot 100 depicting the time (TDT) for the photo diode voltage VPD 66 to reach the detection level, versus illumination level, for different values of initial voltage. As shown in FIG. 7, the time TDT has an inverse linear function, on a Log-Log scale, with the illumination level, with some deviation from this linearity at low illumination levels.

Figure 8:
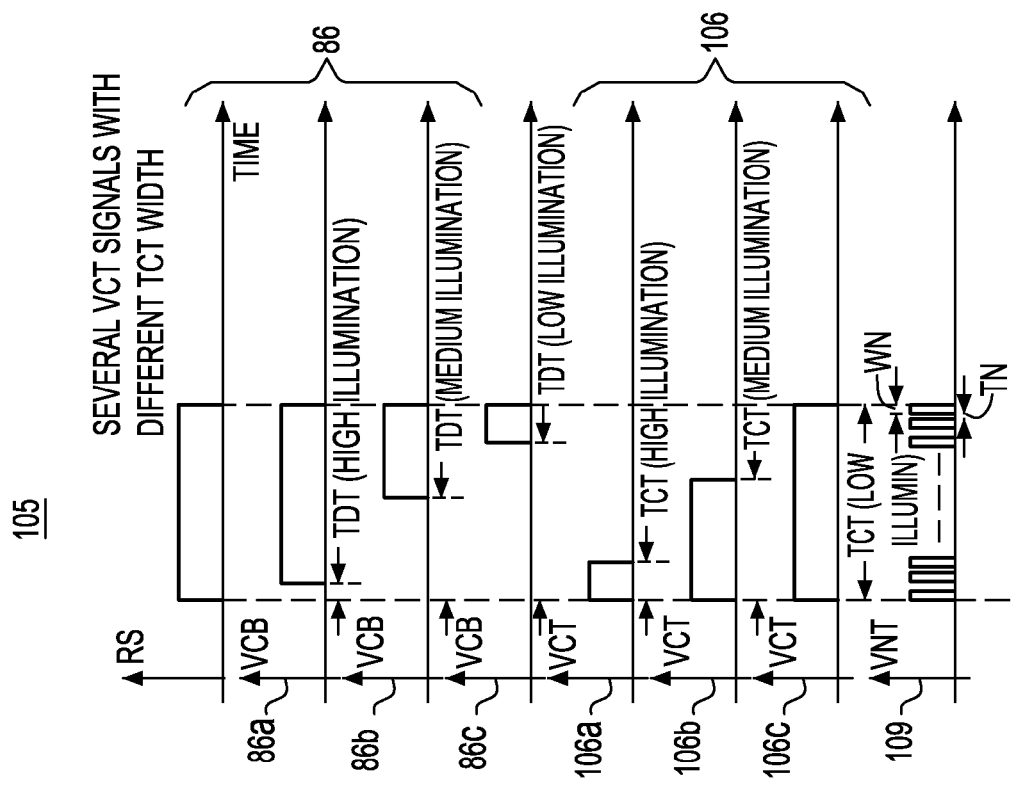
FIG. 8 depicts a signal timing diagram 105 showing several VCT signals 106a, 106b, 106c, that are generated with each VCT signal having a different width TCT that is tuned for a certain illumination band.

Referring now to FIG. 8, there is depicted a signal timing diagram 105 showing several VCT signals 106a, 106b, 106c, that are generated with each VCT signal having a different width TCT that is tuned, i.e. adjusted, for a certain illumination band (range). For example, VCT(x) is for an illumination range of 0.001 to 0.002 ft.cd, and so on. The width TCT is smaller for higher illumination levels. FIG. 8 additionally shows the different VCB response signals 86a, 86b, 86c with respective different TDT delay times 96a, 96b, 96c depending on the respective illumination level; high, medium or low. The pulse train VNT 109 is generated with same total width as the VCT signal 106c corresponding to the lowest illumination range (band). The pulse train VNT 109 has a width WN for each pulse, and the time between pulses is TN. The pulse train VNT can be obtained by an AND function between the RS signal and a continuous pulse signal with a time TN between each two consecutive pulses.

FIG. 9 depicts an exemplary signal timing diagram 110 showing the signals generated for the example instance of pixel cell operation at high incident illumination level. As shown in FIG. 9, the TDT delay time is small as it takes a shorter time for the photo diode voltage VPD 66 to fall to the detect level VDT, corresponding to the threshold voltage of NFET2, and the resulting signal VCB has a smaller delay time TDT. FIG. 9 particularly illustrates what happens for the VCB signal 86a when it interacts with two types of VCT signals with different TCT widths, i.e. different VCT signals 106a, 106b, for example, designed for different illumination ranges. An AND function is performed on the VCT, VCB, and pulse train VNT signals 109. As shown in FIG. 9, when the AND function is performed with an example VCT signal 106a with small TCT width, that is, a VCT signal suited for a high illumination range, the resultant output signal VMT 109a is determined in accordance with the following:

$VMT=\{(VCT, \text{high illumination range})\cdot(VCB, \text{high illumination level})\cdot(VNT)\}.$ The resultant signal VMT 109a, as shown in FIG. 9, has only few pulses, with the first pulse happening early with time delay TDT from the time VCT 106a, also signal RS, goes high. When the AND function is performed with an example VCT signal 106b with a larger TCT width, i.e. designed for a medium or lower illumination range, the resulting VMT output signal is determined in accordance with the following:

$VMT=\{(VCT, \text{low illumination range})\cdot(VCB, \text{high illumination level})\cdot(VNT)\}.$ The output signal in this example, VMT 109b, in this case, has a larger number of pulses than the first case with the VCT signal 106a suited for the high illumination range, with small TCT width. It should be noted that the output signal VMT 109b in the second case with a VCT signal 106b designed for a lower illumination range, has its earliest pulse occurring at same time as the earliest pulse for the first case with a VCT signal designed for a high illumination range. Also this first pulse in VMT occurs with a delay time of TDT from the time VCT, also RS, goes high.

FIG. 10 depicts an exemplary signal timing diagram 115 showing the signals generated for the example instance of pixel cell operation at low incident illumination level. As shown in FIG. 10, the delay time TDT of the VCB signal 86c is large. When the AND function is performed on the signals: VCT, VCB, and VNT 109, the resulting signal is VMT. FIG. 10 depicts the signals generated when the AND function is performed with a VCT signal 106a with small width TCT, i.e. designed for a high illumination range. The output signal VMT is given by:

$VMT=\{(VCT, \text{high illumination range})\cdot(VCB, \text{low illumination level})\cdot(VNT)\}.$ As shown in FIG. 10, the resulting VMT signal 119a has no pulses at all. Depending on the value of TCT for the VCT signal designed for a low to medium illumination range, few pulses could result at the output signal VMT. FIG. 10 additionally depicts the case when the VCT signal 106c has a large TCT width, i.e. designed for a low illumination range. In this case the output signal VMT 119c is given by:

$VMT=\{(VCT, \text{low illumination range})\cdot(VCB, \text{low illumination level})\cdot(VNT)\}.$ In this case with large TCT width, pulses occurs at the output signal VMT 119c, with the first pulse occurring with a time delay of TDT from the time pulse VCT, also RS, goes high.

The output signals VMT's; VMT(1), VMT(2), VMT(3), . . . VMT(x), . . . VMT(n), correspond to the various VCT signals with different values of width TCT; VCT(1), VCT(2), VCT(3), . . . , VCT(x), . . . , VCT(n). Each VCT signal 106 is designed for detection of a certain illumination range (band), e.g., VCT(1) is for the lowest detectable illumination range, and VCT(n) is for the highest illumination range. The output signal VMT(x) is the result of an AND function performed on: VCT(x), VCB, and VNT. Thus all the VMT signals (n signals) generated are due to the input VCT signals (n signals). The signal VCB 86 is the one resulting from the actual incident light that need to be detected. To detect the value of the incident illumination (H), the right illumination range, R(x), in which the illumination level H belongs, must be first identified. Thus, there must be determined the correct VMT(x) output signal resulting from the correct VCT(x) signal designed with a pulse width TCT(x), designed for the illumination range R.

FIG. 2B depicts the novel pixel design 150 according to a second embodiment of the invention using three (3) transistor devices with a PFET transistor replacing the output NFET transistor device as in the first embodiment of FIG. 2A. By using a PFET transistor 153, instead of the output NFET transistor 73 in the first embodiment of FIG. 2A, the PFET will be turned ON when the gate voltage is a magnitude of threshold voltage lower than the source voltage which is the RS signal. Thus, if, for example, RS is at 3.3 V, and the threshold voltage of PFET1 is −0.5 V, the PFET will be ON when the gate voltage reaches 2.8 V. This is in contrast with the case when using NFET2 where the gate need to reach a threshold voltage (about 0.5 V) for NFET2 to be ON. This gate voltage required to turn ON the PFET device 153 is referred to as the detection limit VDT. When the PFET device 153 is ON, the RS signal will appear at the drain of PFET1 which is the signal VCB 86. The signal VCB 86 turning ON will be delayed from the time when the RS signal goes ON, by the delay time TDT. Note that with using PFET1 153 instead of NFET2 73, the signal VCB 86 is generated directly at the drain of the PFET and no need to generate the VCB signals 86 from the signal VWB, by using an XOR (Exclusive OR) circuit, which was necessary when using NFET2.

Figure 11:
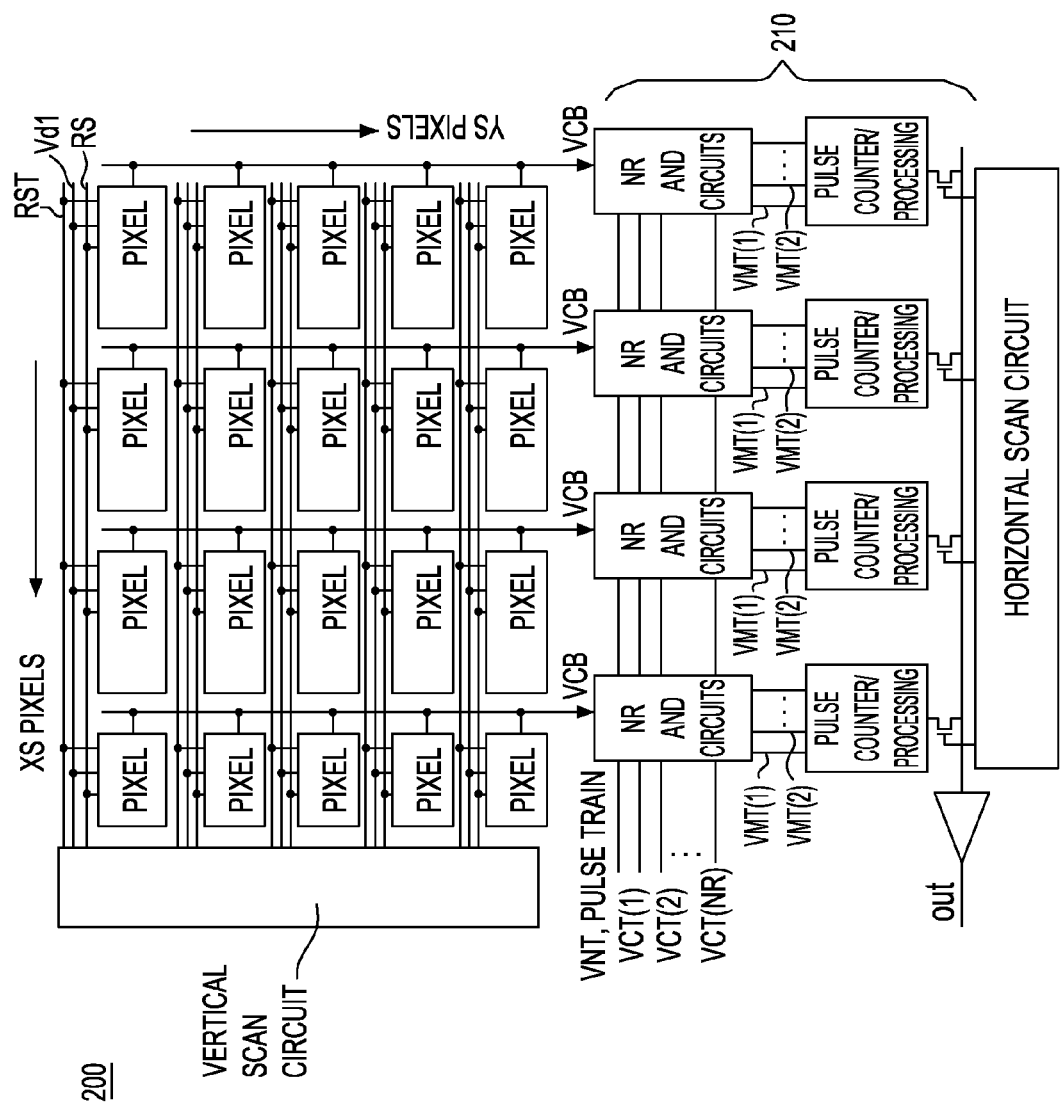
FIG. 11 depicts a pixel array design arrangement 200 implemented according to one embodiment of the invention.

FIG. 11 depicts the pixel array design arrangement 200 implemented according to one embodiment of the invention. The array density is XS×YS, where XS is the number of columns, i.e., the number of pixels that are all triggered by the same RS signal and by the same RST (RESET) signal. Thus all XS pixels will have their VPD voltages drop at the same time as RST signal goes to GND, and also have their NFET2 or PFET1 transistors change state as their VPD voltages reach the detection level VDT. The YS is the number of rows of pixels with each row having XS pixels. Thus there are YS number of RS and RST signals with different timings designed in accordance with the function execution. Because the signal processing at the column bus (referring to FIGS. 2A and 2B), occurs in the time domain, instead of the amplitude domain, all signals from the XS pixels are processed at the same time with each of the XS pixels connected, at least to some degree, to its own pulse detection/processing circuitry 210, and this circuitry is shared with all the other YS rows of pixels.

Figure 12:
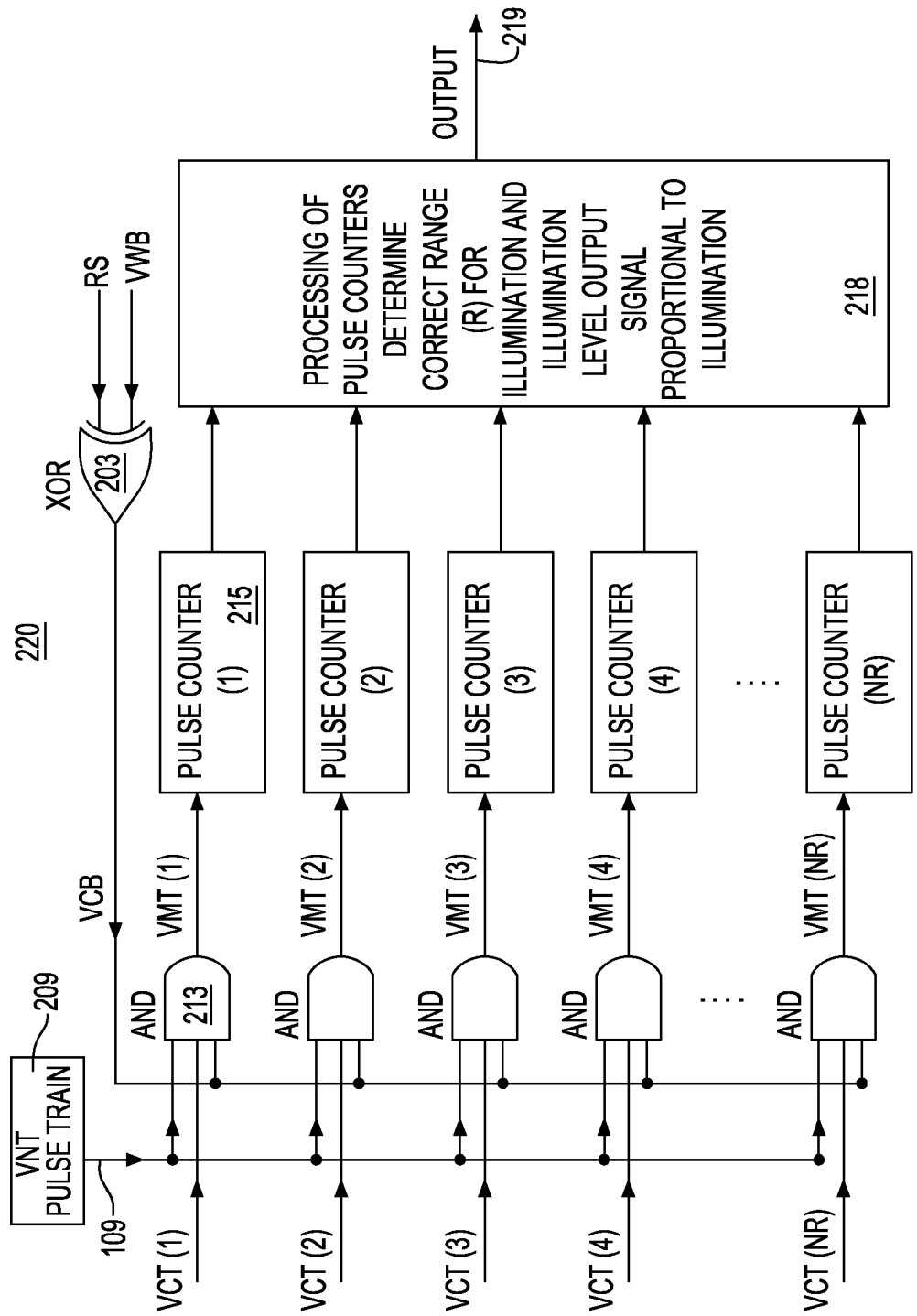
FIG. 12 depicts the processing circuitry 220 for the pulse detection according to the pixel design of FIG. 2A without using the PFET output transistor devices.

FIG. 12 depicts the processing circuitry 220 for the pulse detection according to the pixel design of FIG. 2A without using the PFET output transistor device. Specifically, as shown in FIG. 12, the exclusive OR 203, the AND circuits 213, and the pulse counter circuitry 215 are specific and different for each of the XS pixels and these circuits are shared by all of the YS pixels. The outputs of each pulse counter circuit is input to processing device 218 that determines the correct range for illumination and provides an illumination level output signal 219 that is proportional to the illumination. The VNT pulse train generation circuitry 209, providing the VNT pulse train 109, however, is shared with all YS and XS pixels.

Figure 13:
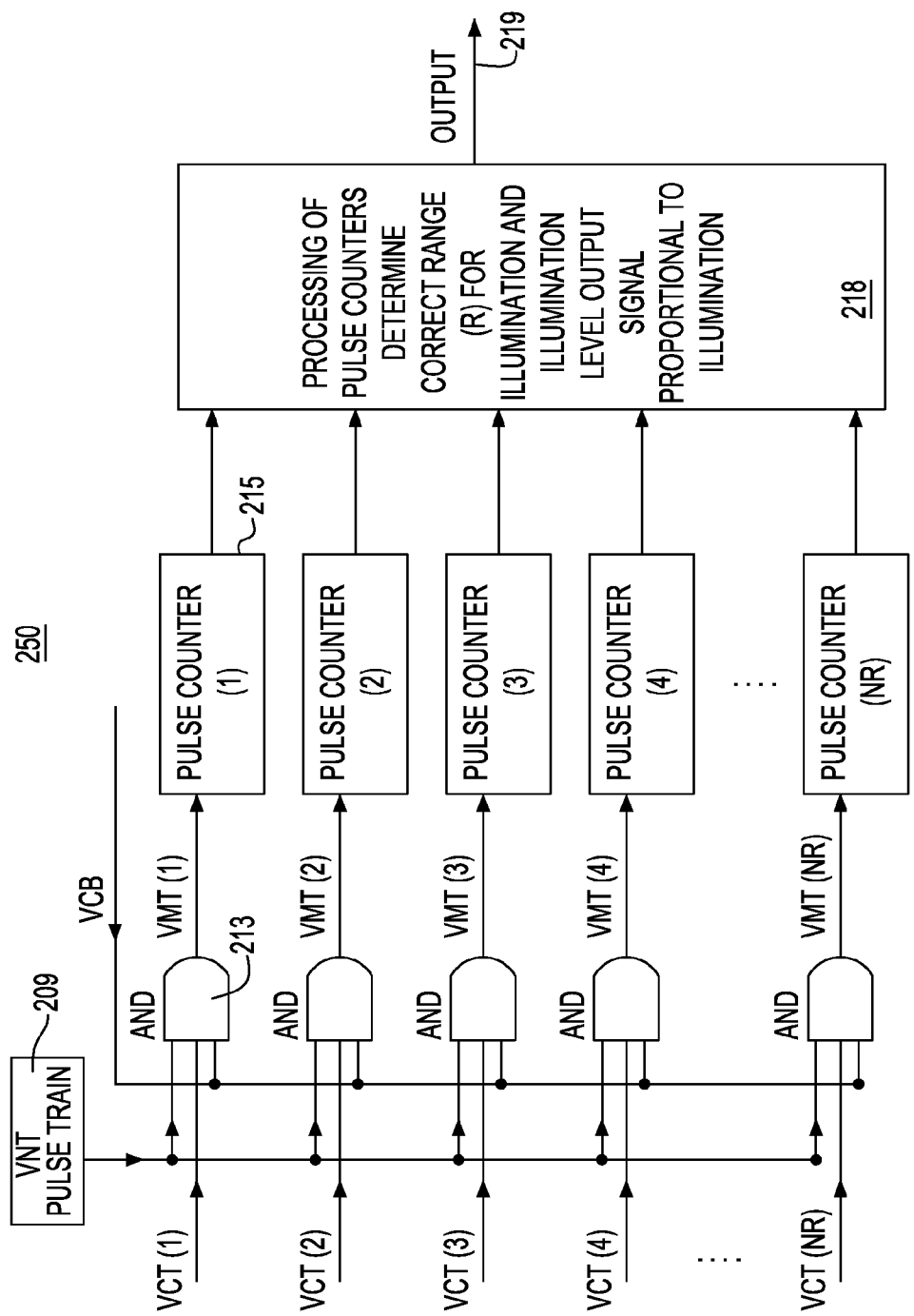
FIG. 13 depicts the processing circuitry 250 for the pulse detection for the pixel circuit design of FIG. 2B using the PFET output transistor devices.

FIG. 13 depicts the processing circuitry 250 for the pulse detection for the pixel circuit design of FIG. 2B using the PFET output transistor device. Specifically, as shown in FIG. 13, the processing circuitry is similar to that of FIG. 12 by providing pulse processing circuits that are different for each of the XS pixels. However, the processing circuitry is the same for the pixels in the YS rows, except that no Exclusive Or (XOR) circuitry is necessary. As shown in FIG. 13, in this regard, the pulse counter circuitry is the more significant, in terms of area requirement than the XOR and AND circuits. As will be described in greater detail herein, there are additional key factors that are used in the pixel array design optimization. These design factors may be quantified for use when optimizing the pixel design, e.g., in terms of signal time processing and area considerations. What follows are the details for the operation of the pulse counters and the design of the illumination ranges according to this aspect of the invention.

As described hereinbefore, for the two pixel design embodiments of the invention (FIGS. 2A and 2B without and with a PFET output transistor, respectively), the signal processing in the time domain results in a certain number of pulses in the signal VMT which is the result of the AND function of: VCT, VCB, and VNT as described herein. The number of pulses in the VMT signal provide the information regarding the incident illumination level for each pixel. For illustrative purposes, the useful illumination range is considered to be: 0.01 ft.cd to 100 ft.cd, however this may vary depending upon the application of the pixel image sensor. This total illumination range may be further divided into several individual smaller illumination ranges, with NR being the number of ranges. Each individual illumination range, R has a lower illumination level HRL(R) and an upper illumination level HRH(R). The performance and quality of the pixel array output is a function of the design of the illumination ranges. As will be seen, the performance and noise immunity is enhanced by increasing the number of illumination ranges, but this increases the complexity of the design of the sensor chip. Other parameters in the optimization of the sensor design are: RESET voltage Vd1, and the detection level VDT. Other important considerations and parameters for the design will be described in greater detail hereinbelow. Each individual illumination range R has a corresponding value of width TCT(R) for signal VCT (see FIG. 8).

The pulse train VNT 109 is shown in FIG. 8, with WN as the width of each pulse and TN is the time between two pulses. The sum: (WN+TN) is the period (τVNT) for VNT and the inverse of τVNT is the pulse frequency. For exemplary purposes, the analysis is performed for WN=TN. The number of pulses NHR(R, H) in a given illumination range R, at an illumination level H, is calculated according to the following:

$$[TCT(R)-TDT(R,H)] = \{[2 \times NHR(R,H)]-1\} \times WN \quad (7)$$

Thus, $$NHR(R,H) = \{[(TCT(R)-TDT(R,H))/WN]+1\}/2 \quad (8)$$

where TCT(R) is the width TCT for the pulse VCT in the illumination range R, and TDT(R, H) is the time delay TDT in the range R at an illumination level H. As shown in FIG. 9, for instance, the minimum and maximum illumination levels for each illumination range determine the bounds on the detection time TDT for the signal VCB. These bounds for a given illumination range R are identified as TDTL(R) and TDTH (R). The lower time TDTL(R) corresponds to the upper illumination level of the range HRH(R) and the higher time TDTH(R) corresponds to the lower illumination level HRL(R) of the range. The width TCT for signal VCT has to be the largest for the illumination range with the lowest illumination level. This is because for the lowest illumination level, TDT is the largest and hence TCT has to be large enough to yield pulses at the output VMT. Correspondingly, the illumination range with the highest illumination levels, will have the lowest number of pulses and the range with the lowest illumination levels will have the largest number of pulses. In each individual illumination range, R the number of pulses is higher at higher illumination levels. Each individual illumination range has a range of number of pulses that identifies that range R, with NHRL(R) and NHRH(R) as the minimum and maximum number of pulses in the illumination range R, and NHR(R,H) is the number of pulses at an illumination level H in the range R. NHRL(R) corresponds to the lower illumination level HRL(H) of the range and NHRH(R) corresponds to the higher illumination level HRH(R).

Figure 24A:
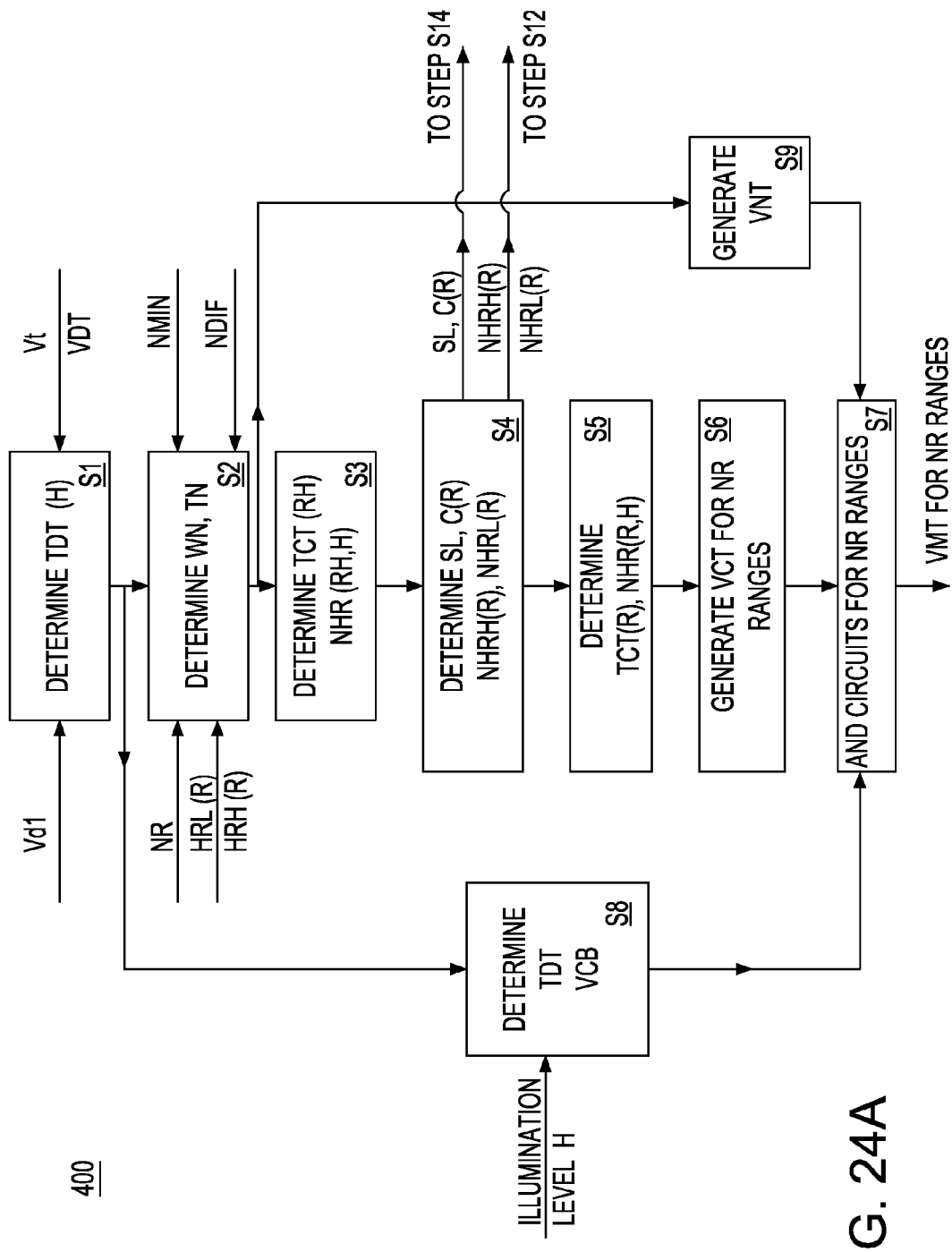
FIGS. 24A and 24B depict a methodology 400 for designing the illumination ranges for the pixel sensor cell of the invention.
Figure 24B:
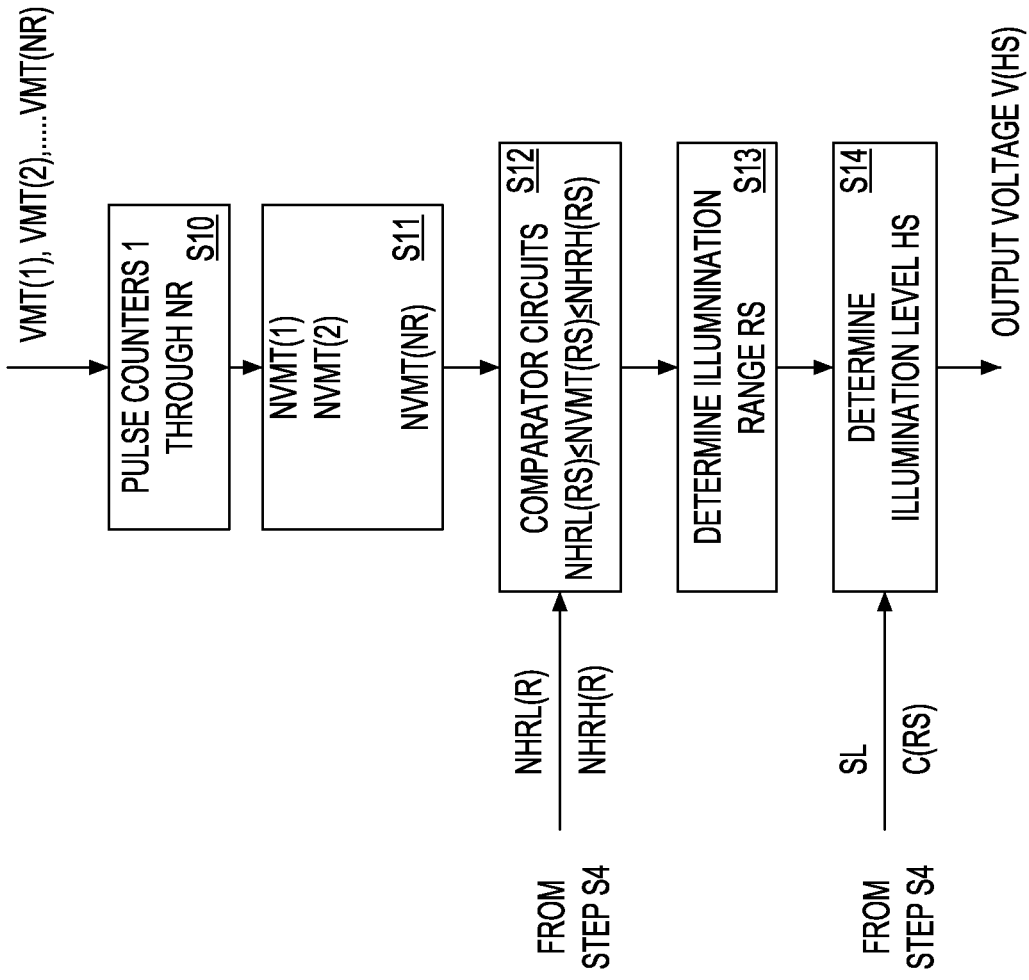

One methodology 400 for designing each embodiment of the pixel cell of the invention and optimizing key design parameters, e.g., the illumination ranges, is now described with respect to FIGS. 24A and 24B.

In a first step S1 shown in FIG. 24A, a determination is made of the TDT(H) value for an incident illumination value (H). As depicted in this step, selection of the RESET voltage Vd1 (FIGS. 2A and 2B), the detection voltage level VDT, and the voltage threshold of the output device (nFET or pFET) are optimized as will be described in greater detail hereinbelow. For instance, a consideration of the voltage value Vd1 is in relation to the selection of VDT, e.g., a small Vd1 will have advantages for lower power and better reliability. Note that, referring to step S8 in FIG. 24A, the TDT and VCB values are determined for the illumination level H. These TDT and VCB values for the illumination level H will be input to AND circuits for each of the NR ranges as described herein with respect to step S7. Next, referring back to step S2, key design parameters—the pulse width (WN) and pulse spacing (NT) of the VNT pulse train are optimized based on selected design parameters including: the number of individual illumination ranges (NR), the lower illumination level HRL(R) corresponding to the illumination level H in a range R, the maximum illumination level HRH(R) corresponding to the illumination level H in a range R, and selection of two additional variables NMIN and NDIF as now described.

Particularly, as shown in Step S2, the two additional key variables in the design of the individual ranges are: 1) NMIM, the minimum number of pulses in the highest illumination range (herein referred to as RH). Thus NMIN is the lowest number of pulses that could be detected by the system, i.e., NMN=NHRL(RH) which also corresponds to the lower illumination level HRL(RH) of the range RH; and, 2) NDIF, the difference between the maximum [NHRH(RH)] and minimum [NHRL(RH)] number of pulses in the range RH with the highest illumination level. The choice of values for NMIN and NDIF is very important for the image quality, reduction of detection error, and immunity against noise. If NDIF is too small, the effect of noise is higher and the potential error in detecting the correct illumination level may increase. However, a key advantage of the present invention is that this smallest number of pulses, corresponding to the highest illumination range, is less vulnerable to noises. Yet, NMIN should not be too small, as it could be affected by the pulse counter circuitry. NDIF is very key as it determines the error in detecting the correct illumination level, and the quality of the image. If NDIF is too small, a potential error may result in detecting some intermediate illumination levels in the highest illumination range.

The quantified analysis approach to the illumination range design is described in greater detail hereinafter. It is noted however, that by increasing NDIF and NMIN will lead to higher values for the number of pulses in the lowest illumination range and thus more area required and more complexity for the pulse detector circuitry.

For the range RH with the highest illumination levels, TCT is TCT(RH) and the minimum and maximum values for TDT are respectively: TDTL(RH) and TDTH(RH). Note that TDTL(RH) corresponds to the maximum illumination level HRH(RH) of the range RH, and TDTH(RH) corresponds to the minimum illumination level HRL(RH). Thus, applying equation (8) hereinabove for NMIN yields the following:

$$NMIN=\{[(TCT(RH)-TDTH(RH))/WN]+1\}/2 \quad (9)$$

Additionally, from the definition of NDIF, the value for NHRH(RH) is obtained as follows, which is the maximum number of pulses in the range RH, i.e., the number of pulses at the highest illumination level in the range RH $$NHRH(RH)=NMIN+NDIF \quad (10)$$

For the highest illumination level HRH(RH) of the range RH, the number of pulses is given by:

$$NHRH(RH)=\{[(TCT(RH)-TDTL(RH))/WN]+1\}/2 \quad (11)$$

Subtracting equation (11) from equation (9), yields the following:

$$WN=[TDTH(RH)-TDTL(RH)]/\{2\times[NHRH(RH)-NMIN]\} \quad (12)$$

The difference on the right hand side of equation (12) is equal to NDIF. Thus, $$WN=[TDTH(RH)-TDTL(RH)]/[2\times NDIF] \quad (13)$$

From equation (13), the width and pulse spacing for the signal VNT is optimally determined. These WN and TN values based on the selected design parameters as described with respect to step S2 are used to generate the VNT pulse train as shown at step S9, FIG. 24A, and which are subsequently input to the AND circuits for the NR ranges as described herein with respect to step S7.

Referring back to FIG. 24A, continuing to step S3, the width TCT(RH) is determined from equation (9) which can be written as:

$$TCT(RH)=WN\times[(2\times NMIN)-1]+TDTH(RH) \quad (14)$$

Further, as shown in step S3, FIG. 24A, the number of pulses NHR(RH,H) in the range RH, at an illumination level H, is determined as follows:

$$NHR(RH,H)=\{[(TCT(RH)-TDT(RH,H))/WN]+1\}/2 \quad (15)$$

For the other individual illumination ranges, the minimum and maximum number of pulses are determined as follows: Note that it is understood that the relationship between the number of pulses and illumination level, in any illumination range, is not linear on a Log-Log scale. It is highly desirable to have a power relationship between the number of pulses and the illumination level in the range, i.e. Linear relationship on a Log-Log scale (will be referred to as Linear Log-Log), and furthermore to have the slope of the straight line, i.e., the exponent of the power relationship the same for all ranges, as this significantly simplifies the conversion in the sensor circuitry from number of pulses to illumination level in each range. If the relationship is not linear, the conversion to illumination levels would have to be done, for example by circuits that employs look up tables and complex non-linear circuit, one for each range. Thus, the Linear Log-Log relationship can be expressed according to equation 16) as follows:

$$NHR(R,H)=C(R)\times H^{SL} \quad (16)$$

where C(R) is a constant which depends on the illumination range R, H is the illumination level in the range R, and SL is the slope of the Linear Log-Log relationship and it is the same for all illumination ranges. This linear design on a Log-Log scale, as shown herein with respect to FIG. 24A, step S4, which yields optimal derivation of design parameters SL, C(R), the minimum number of pulses [NHRL(R)] and maximum number of pulses [NHRH(R)] corresponding, respectively, to the minimum [HRL(R)] and maximum [HRH(R)] illumination levels of the range R, will result in small errors with the proper design of number of illumination ranges NR and the derivation of the optimum slope (SL) for this Linear Log-Log relationship. The optimum design for the Linear Log-Log scale is to have the straight line join the minimum [NHRL(R)] and maximum [NHRH(R)] number of pulses corresponding, respectively, to the minimum [HRL(R)] and maximum [HRH(R)] illumination levels of the range R, and this will result in minimum error. Thus, starting with the range RH which has the highest illumination levels, the slope SL for the Linear Log-Log relationship is given by equation 17) as follows:

$$SL = \{\text{Log}[NHRH(RH)/NHRL(RH)]\}/\{\text{Log}[HRH(RH)/HRL(RH)]\} \quad (17)$$

From equation (15), the difference between the maximum and minimum number of pulses for each illumination range R, is given by:

$$NHRH(R) - NHRL(R) = [TDTH(R) - TDTL(R)]/(2 \times WN) \quad (18)$$

Additionally, by employing equation (16), the constant C(R) for the illumination range R is determined as:

$$C(R) = [NHRH(R) - NHRL(R)]/\{[HRH(R)]^{SL} - [HRL(R)]^{SL}\} \quad (19)$$

and the difference [NHRH(R)−NHRL(R)] is given by equation (18). With C(R) determined and employing equation (16), the minimum and maximum values for the number of pulses in the range R are given by:

$$NHRH(R) = C(R) \times [HRH(R)]^{SL} \quad (20)$$

and $$NHRL(R) = C(R) \times [HRL(R)]^{SL} \quad (21)$$

Referring back to FIG. 24A, continuing to step S5, the width TCT(R) for the range R and the number of pulses at an illumination level H, in the range R (i.e., [NHR(R,H)] are then determined. Particularly, the width TCT(R) for the range R is given from equation (14) as follows:

$$TCT(R) = WN \times \{[2 \times NHRL(R)] - 1\} + TDTH(R) \quad (22)$$

The number of pulses at an illumination level H, in the range R is then given by:

$$NHR(R,H) = \{[(TCT(R) - TDT(R,H))/WN] + 1\}/2 \quad (23)$$

Using the Linear Log-Log design concept introduced for the relationship between the number of pulses and illumination level within a given illumination range, the approximate number of pulses [NHRA(R,H)] in an illumination range R, at an illumination level H is given by:

$$NHRA(R,H) = C(R) \times H^{SL} \quad (24)$$

Note that, according to the design concept described herein, at the minimum [HRL(R)] and maximum [HRH(R)] illumination levels, respectively, of the illumination range R, the number of pulses given by equation (24) is exact and not approximate. The percent error [PNHR(R,H)] in determining the number of pulses in an illumination range R, and an illumination level H, using the straight line approximation on a Log-Log scale with the slope of SL for all illumination ranges, is given by:

$$PNHR(R,H) = [NHRA(R,H) - NHR(R,H)] \times 100/NHR(R,H) \quad (25)$$

Note that the error at the minimum and maximum illumination levels of each illumination range is zero.

To perform imaging at the correct illumination level is now described. As depicted in FIG. 24A, step S6, first the VCT are generated for each of the NR ranges as described with respect to FIGS. 8-10, for example. Then the TDT, VCB, VCT and the generated VNT values are input to the AND circuits (e.g., as shown in the pulse detection processing circuitry of FIGS. 12, 13) to determine the correct illumination.

Thus, referring back to FIG. 12 (pixel processing circuit for pixel cell with no output PFET transistor) and FIG. 13 (pixel processing circuit design for pixel cell with output PFET transistor), and respective FIGS. 2A and 2B, the pulse detection, and conversion circuitry for converting from number of pulses to the incident illumination level (HS) is now described. The first part of the detection procedure, as represented in FIG. 24B, steps S10 and S11, is to count the number of pulses in the signal VMT. The signal VMT is the signal resulting from the AND operation of the signals: VNT, VCT, and VCB as described herein with respect to FIGS. 9 and 10. As sown in FIG. 12 for the pixel design of FIG. 2A, without PFETs, the signal VCB is the output of the exclusive OR of the signals RS and VWB. The first step of the pulse detection circuitry is to count the number of pulses [NVMT(R)] in the signal [VMT(R)], where R is the particular illumination range and thus R varies from 1 to NR where NR is the number of the illumination ranges. As further depicted in step S12, FIG. 24B, all of the outputs of the pulse counters [NVMT(R)] are then input to comparator circuitry where the number of pulses are compared with the minimum and maximum number of pulses; NHRL(R) and NHRH(R) in each range. Then, as further depicted in step S13, FIG. 24B, the correct illumination range (RS) in which the incident illumination level (HS) belongs to is determined as the one where the number of pulses [NVMT(RS)] is equal to or greater than NHRL(RS), and [NVMT(RS)] is equal to or less than NHRH(RS). Note that if the incident illumination level (HS) to be detected is at the minimum or maximum illumination levels of a range, then this illumination level may belong to two consecutive illumination ranges. In one embodiment, the lowest illumination range in which the incident illumination level could belong is identified as the correct range RS. This reduces the error in detection since lower illumination ranges contains higher number of pulses. Another design consideration in the counting of the number of pulses is that it is possible that the pulse at the end of the signal VMT would not be of the same pulse width WN, as the other pulses within the signal VMT. This is because the width TCT of the signal VCT may not contain exact integral number of pulses of the signal VNT. In this case the pulse detection circuitry is designed to count a pulse if its width is equal to or greater than 0.25 of the design width WN.

Continuing at step S14, FIG. 24B, with the correct range RS determined from the output signals VMT(R), the next step is to determine the correct incident illumination level HS. Particularly, the number of pulses NS identified for the range RS is converted to illumination level using the described Linear Log-Log relationship. HS is determined by equation (26) as follows:

$$\text{Log}(HS) = (1/SL) \times \text{Log}[NVMT(RS)/C(RS)] \quad (26)$$

Thus [NVMT(RS)] is first scaled by the constant [C(RS)] of the range RS then the logarithm of the result is scaled by the slope SL which is the same for all illumination ranges. The exponential of the result is the illumination level HS.

As mentioned hereinabove with respect to FIG. 24A, step S1, the selection of the RESET voltage Vd1 (FIGS. 2A and 2B) and the detection voltage VDT is now described as follows:

As the pixel sensor design of the present invention is based on time scale, Vd1 does not have to be large to the extent as needed in conventional designs which are based on amplitude detection. The requirement here on Vd1 is in relation to the selection of VDT. With Vd1 smaller than in other designs, this will have advantages for lower power and better reliability. For the pixel design of FIG. 2A without PFETs, a design with triple well for NFET2 could be used with consideration that the triple well would have to be deep enough to accommodate the essential optical visible range. With a triple well design included, the Vt for NFET2, for all the pixels, could be adjusted which could give a much better design. In general, with a well potential VWN, NFET2 will conduct when VPD reaches the VDT voltage as follows:

$$VDT = Vt + \Delta Vt \quad (27)$$

Note that $\Delta Vt$ is the change in Vt due to the well potential VWN, and Vd1 is designed to a value larger than VDT by a certain amount. For the pixel design of FIG. 2B with PFET1, the N-well voltage could be adjusted for all the pixels to a value of VWP, with VDT voltage given by:

$$VDT = RS - |Vt| - \Delta Vt \quad (28)$$

where again, $\Delta Vt$ is the magnitude of decrease in Vt for the PFET with a well potential VWP. There are two major advantages in a pixel design with an adjustable well voltage with or without a PFET in the pixel design. First, with a well potential it is possible to reduce the variations of Vt across the pixel array, which in turn will reduce the variations of the detection voltage VDT. Reducing the variation of Vt across the array is important for reduction of detection error and fixed pattern noise (FPN). Second, for the pixel design of FIG. 2A (no PFETs) a well potential is necessary to set VDT not much lower than Vd1. This is because if Vd1 is 1.0V, for example, and VDT is desired to be 0.8V or 0.9V, then a well potential is necessary to raise the VDT. Normally the Vt for the NFET without a well voltage could be designed to about 0.6V or so, then the well voltage could raise it to the desired value of 0.9V. If the RESET voltage Vd1 for the pixel design of FIG. 2A without PFET is 1.5V, for example, it would be very difficult to set VDT close to Vd1 at a value of about 1.3V because it would require VT for NFET2 to be 1.3V which means that a considerable well voltage would be required with a very substantial voltage pump circuit, beyond practical considerations. However, by setting VDT not much lower than Vd1 is necessary to reduce the signal processing time to reasonable values.

For the pixel design of FIG. 2B with PFET1, as given by equation (28), the Vt without a well voltage could be adjusted to −0.3V, then VDT is 1.4V for an RST voltage value of 1.5V. The variations across the pixel array due to channel length and oxide thickness variations could be about +/−15 mV, which is about +/−2.5% for a Vt of 0.6V for NFET2 of the pixel design of FIG. 2A, and about 5% for a Vt of −0.3V for PFET1 of the pixel design of FIG. 2B. With VDT designed to a value of 0.9V and RST is 1.0V (typical for NFET design), then with using a well potential for NFET2, the Vt variation across the array would cause a variation of VDT across the array to be about +/−1.7%, and only +/−1.0% for VDT of 1.4V and Vd1 of 1.5V for the pixel design with PFET1. Additionally, the variations of Vt from chip to chip, wafer-to-wafer, lot-to-lot and fabrication facility-to-fabrication facility which could be as high as 50 mV as well as the variations of the mean of Vt are important considerations to take into account. The variations of Vt around the mean may be about 10%, but with employing a well potential with a fixed value across the board for all wafers, the variations in VDT is about 6.7% with for the NFET design with VDT 0.9V and Vd1 of 1.0V, and the variations on VDT is about 2.3% for the PFET design with VDT of 1.4V and Vd1 of 1.5V. With an adjustable well potential, the effect of VT variations could be even further reduced. This may be exemplified by a scheme where the well potential could be adjusted automatically prior to scan to the design value, to account for, e.g., the temperature variations as well as variations in the mean value of Vt.

An important advantage of raising the Vt by well potential is to reduce the detection time TDT, which is the most significant component of the detection/signal processing in the time domain. Reducing the effect of Vt variations is additionally important for reduction of noise such as fixed pattern noise (FPN). With proper deign of the RESET (Vd1) voltage for the pixel designs with and without PFETs, the well potential does need to be large and thus, the pump circuit for the well voltage would not require large area or high amount of current consumption. Referring to FIG. 6, TDT is a strong function of VDT and hence Vt, and could be a fraction of a second if the VDT is significantly less than the RESET voltage Vd1.

From the above-identified design considerations, the following are the key components for the design optimization; an example embodiment which will be considered for illustration of the design optimization are described herein with respect to the pixel design implementing the PFET 1 output transistor device of FIG. 2B:

1. RESET voltage Vd1 to be set at 1.5V for the pixel design with PFET1 as shown in FIG. 2B;
2. Detection voltage, VDT. Values to consider are: 0.8V, 1.0V, 1.2V, 1.3V, 1.35V, 1.4V;
3. Number of individual illumination ranges, NR. Values to consider are: 8, 16 and 32 ranges;
4. Lowest number of pulses in the highest illumination range, NMIN, and the difference between the maximum and minimum number of pulses in the highest illumination range, NDIF. Example values of these NMIN and NDIF factors to consider are: NMIN: 2, 2, 3 and NDIF: 2, 4, 7, for the highest illumination range.

Figure 14:
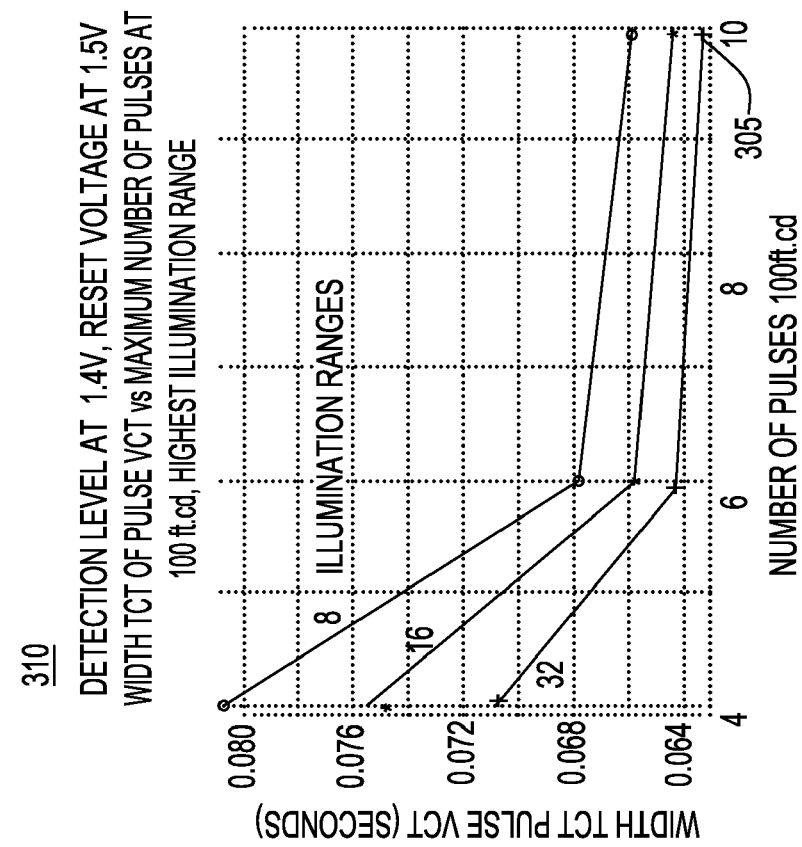
FIGS. 14, 15 and 16 depict respective plots illustrating the effect on TCT pulse width due to: detection level (VDT), the number of pulses [NHRH(RH)] at the highest illumination level to be detected in an illustrative example, and the number of individual illumination ranges (NR)
Figure 15:
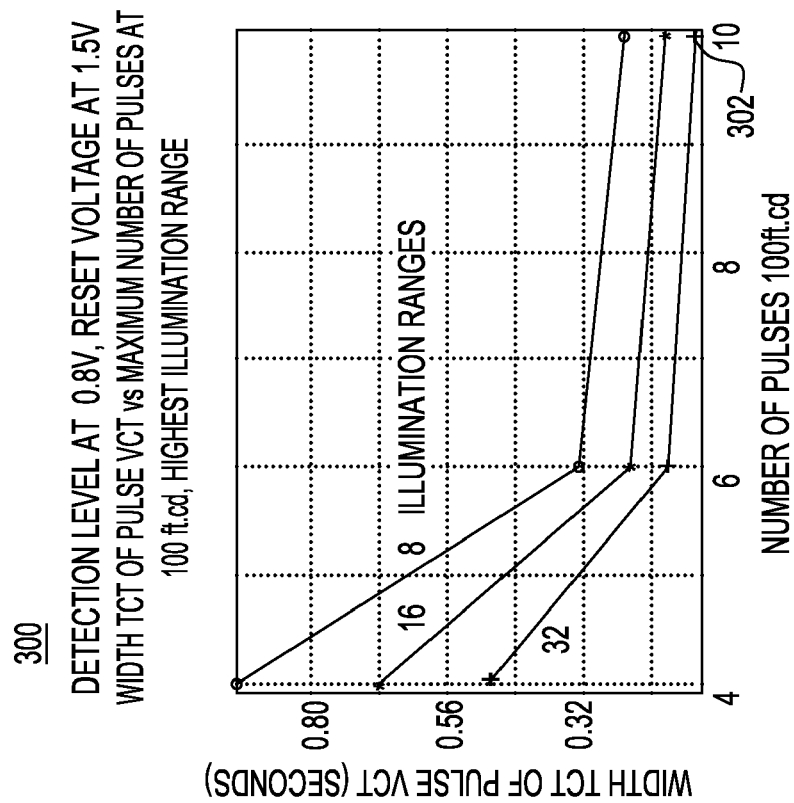
Figures 16, 17:
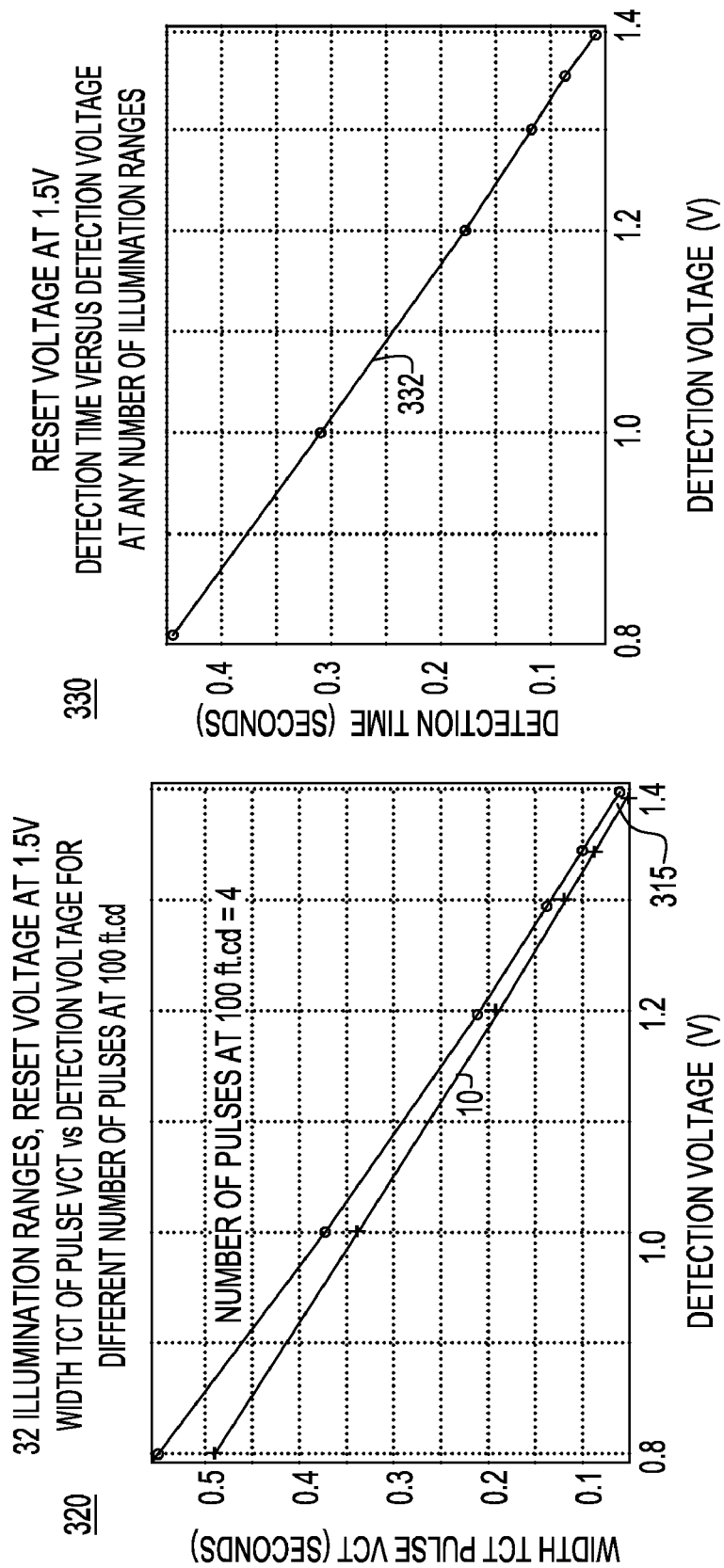
FIG. 17 illustrates an example plot 330 depicting the relationship 332 of detection time TDT versus detection voltage VDT.

Referring now to FIGS. 14, 15 and 16, there is depicted respective plots illustrating the effect on TCT pulse width due to: detection level (VDT), the number of pulses [NHRH(RH)] at an illumination level of 100 ft.cd., for example, which is the highest illumination level to be detected in the illustrative example and which is given by [HRH(RH)], and the number of individual illumination ranges (NR). From the above definitions the following equations are obtained:

$$NMIN = NHRL(RH) \quad (29)$$

and, $$NHRH(RH) = NMIN + NDIF \quad (30)$$

Figure 1:
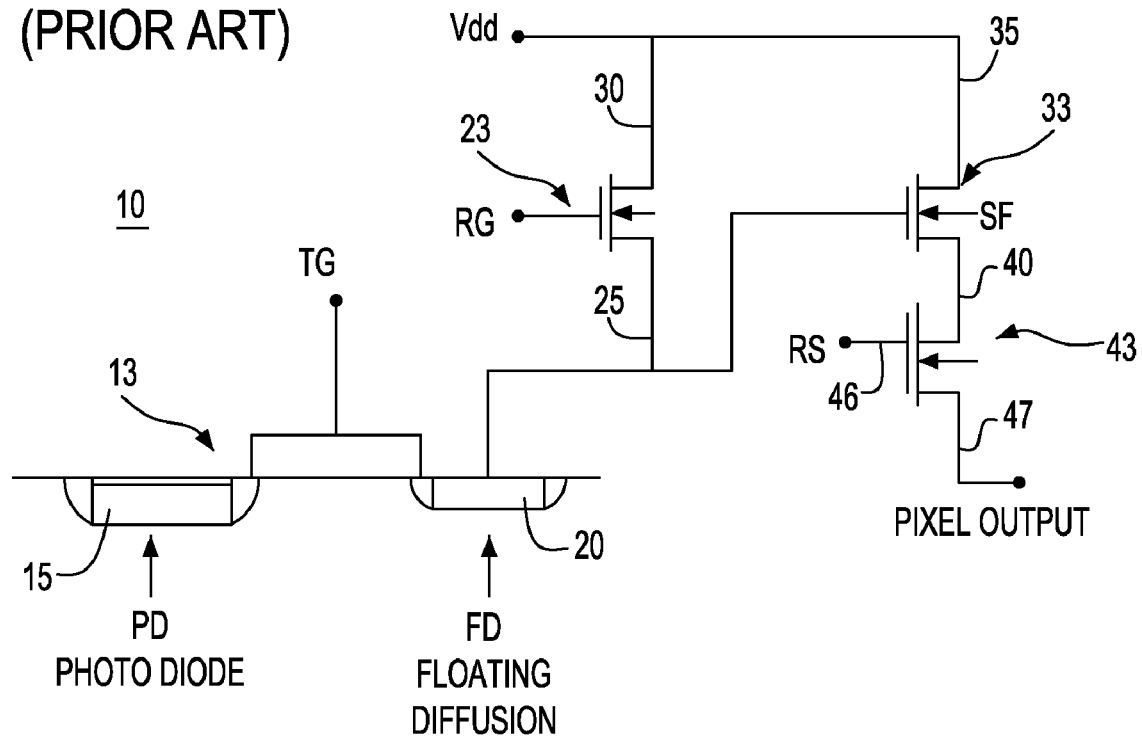
FIG. 1 illustrates a typical four (4) device CMOS pixel design 10 implementing NFET devices according to the prior art.

The results of each plot detail the effect on TCT due to VDT, NR and NHRH(RH). As the detection level VDT increases from 0.8V as depicted in the plot 300 provided in FIG. 14, to 1.4V as depicted in the plot 310 provided in FIG. 15, with both example plots at NHRH(RH)=10, and NR=32, the value of TCT is shown to decrease from about 0.49 seconds as indicated at 302, FIG. 14, to about 0.063 seconds as indicated at 305, FIG. 15. Also as NR is increased from 8 to 32, as depicted in the plot 310 provided in FIG. 15, and at NHRH(RH)=10, and VDT=1.4, TCT is reduced from a value of about 0.066 seconds to about 0.063 seconds. Thus, there is about 680% increase in TCT in decreasing VDT from 1.4V to 0.8V while an increase in NR from 8 to 32, decreases TCT by only 4.5%. Additionally, by increasing NHRH(RH) from 6 pulses to 10 pulses, at VDT=1.4V, and NR=32, reduced TCT from about 0.064 seconds to about 0.063 which is only about 1.6% as indicated at 315 in the plot 320 depicted in FIG. 16. There is however a more significant effect on TCT when NHRH(RH) is reduced below 6 pulses. Decreasing NHRH(RH) from 6 pulses to 4 pulses, at NR=32, and VDT=1.4V, increases TCT from 0.064 sec. to about 0.071 sec. which is about 11% increase. Further, decreasing NHRH(RH) from 6 pulses to 4 pulses, at NR=8, and VDT=1.4V, increases TCT from about 0.068 sec. to about 0.081 which is almost a 20% increase. From these results, VDT has the most significant effect on TCT.

Additionally, as shown in the plot 330 of FIG. 17 depicting the relationship 332 of detection time TDT versus detection voltage VDT, it can be seen that increasing the VDT detection voltage has a significant effect on reducing of the detection time TDT. Increasing VDT to be as close as possible to Vd1 is key to minimizing TCT. Thus, employing a well potential for the pixel design of FIG. 2A (without the PFET output device) is an important element in the optimization of the pixel and sensor design with processing in the time domain. Ideally, there is a sufficient difference between Vd1 and VDT such that noise does not interfere with the conduction of NFET2 (FIG. 2A) or PFET1 (FIG. 2B) and this difference should be sufficient to avoid noise. For the example design case provided for the pixel sensor circuit with PFET1 (FIG. 2B), VDT is kept at 1.4V for a RESET voltage Vd1 of 1.5V. For the example design case provided for the pixel sensor circuit with NFET2 pixel design (FIG. 2A), which will be discussed in more detail hereinafter, Vd1 is 1.0V and VDT is 0.9V. The optimum design choice for NR and NHRH(RH) is additionally influenced by other factors as well now be demonstrated.

Figure 18:
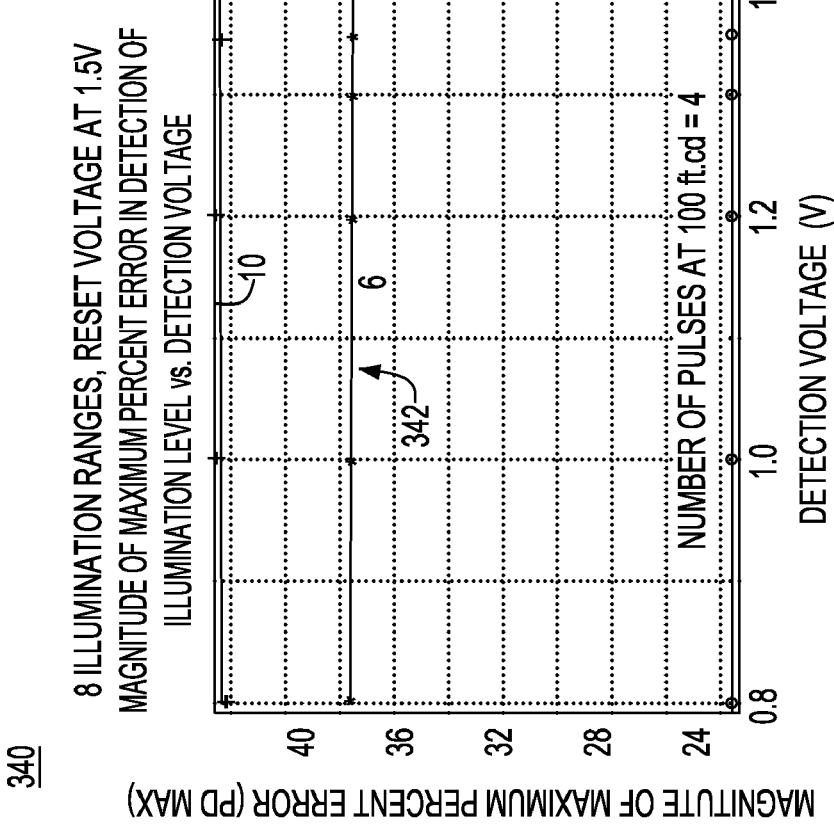
FIG. 18 depict example plots 340 showing the relationships 342 between PDMAX versus detection voltage VDT, given an RST of 1.5V, RN of 8, and several values of [NHRH (RH)]

A second important consideration for the optimization of the pixel and sensor design is the error in detection of the illumination level, which was introduced previously as [PNHR(R,H)] in equation (25) hereinabove. The error was calculated for the design cases to consider for the pixel design with PFET1. As will be referred to herein, the maximum magnitude of [PNHR(R,H)], for any design case, is referred to as [PDMAX]. FIG. 18 depicts an example plot 340 showing the relationships 342 between PDMAX versus detection voltage VDT, for Vd1 of 1.5V, RN of 8, and several values of [NHRH(RH)], e.g., NHRH(RH)=6. The resultant plots depicted in FIG. 18 show that VDT does not influence [PDMAX].

Figure 19:
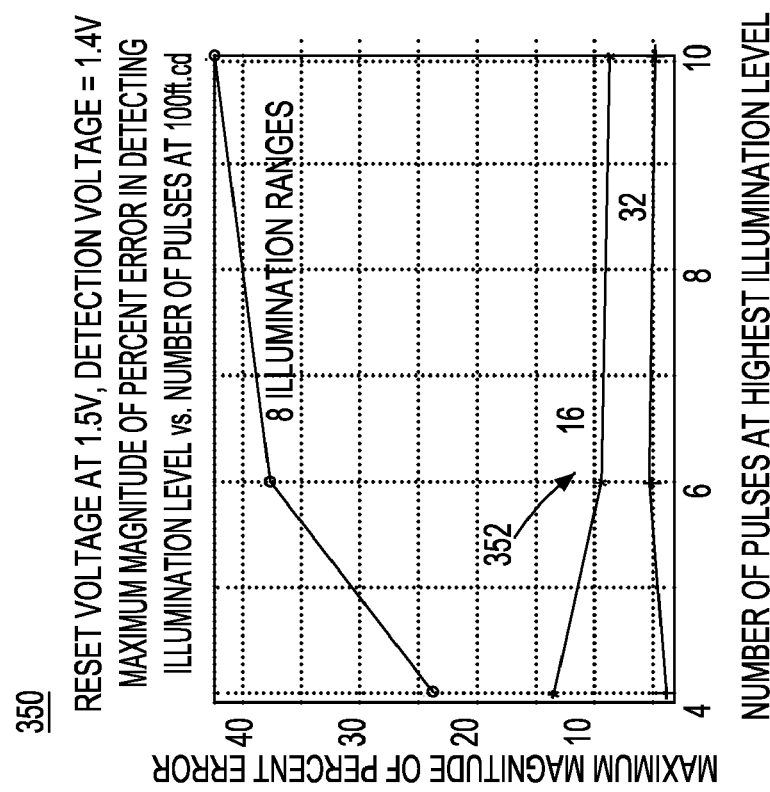
FIG. 19 depict example plots 350 showing the relationships 352 between PDMAX versus the [NHRH(RH)] (number of pulses at the highest illumination level) values for different number of ranges NR.

FIG. 19 depicts an example plot 350 showing the relationships 352 between PDMAX versus the [NHRH(RH)] (number of pulses at the highest illumination level) values for different number of ranges NR. FIG. 19 particularly shows that NR has a strong influence on PDMAX. FIG. 19 additionally shows that [NHRH(RH)] may influence [PDMAX] when [NHRH(RH)] is lower than 6 pulses, but above 6 pulses PDMAX is affected by [NHRH(RH)] only for NR of 8, but virtually unaffected by [NHRH(RH)] for NR of 16 or 32. From these results, an optimum design with a maximum error PDMAX, equal to or less than 10% can be obtained with NHRH(RH)=6, and NR=16. As was shown in equation (30) hereinabove, NHRH(RH) is determined by NMIN and NDIF. Thus, from the example design cases under consideration here, NHRH(RH) of 6 pulses may be achieved with NMIN=2 and NDIF=4. It should be noted that a value of 6 for NHRH(RH) could also be achieved with other combinations of NMIN and NDIF, for example, NMIN of 3 and NDIF of 3. There are other considerations that should be considered for the optimum choice of NMIN and NDIF: First, is the optimum choice of NMIN and the influence of noise. If NMIN is too low, noise interference could be significant. Noise here is defined in terms of loss of detecting sufficient number of pulses, if the number is too small. The design criterion here is that the noise effect could result in loss of one pulse in the range of the lowest number of pulses which also is the range of highest illumination levels. It should be noted that by virtue of this type of design for the highest illumination level, the noise effect is minimized. If, for example, a 100 ft.cd illumination level is incorrectly detected as 90 ft.cd., percentage wise the effect is not too large. Thus, from this design criterion, the optimum design choice for NMIN is 3. The second consideration is NDIF. NDIF should also be large enough so that no distortion will result in detection of illumination level at the highest illumination range, and with values in between the minimum and maximum illumination levels of that range.

Figure 20:
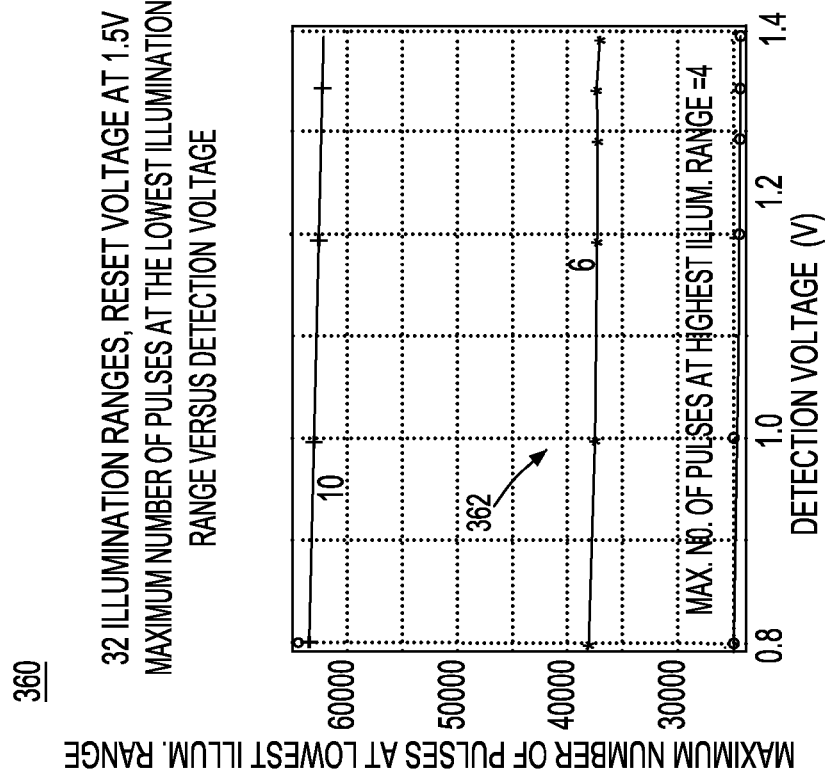
FIG. 20 shows an example plot 360 depicting the relationships 362 between the maximum number of pulses at the lowest illumination range versus the detection voltage.

A third consideration for NDIF and hence NHRH(RH) is the maximum number of pulses that are required in the design for the range with the lowest illumination levels. This parameter is referred to as NHRH(RL) where NHRH is for the highest number of pulses in the range RL with the lowest illumination levels. FIG. 20 shows an example plot 360 showing the relationships 362 between the maximum number of pulses at the lowest illumination range versus the detection voltage. FIG. 20 particularly shows that the maximum number of pulses is not influenced by the detection voltage VDT, but is strongly influenced by NHRH(RH). For example, by increasing NHRH(RH) from 4 pulses to 10 pulses, has the effect of more than doubling NHRH(RL). Increasing NHRH(RH) from 4 pulses to 6 pulses, increases NHRH(RL) from about 25,000 to about 37,5000. Increasing NHRH(RH) is due to increasing one or both of NMIN and NDIF.

Figure 21:
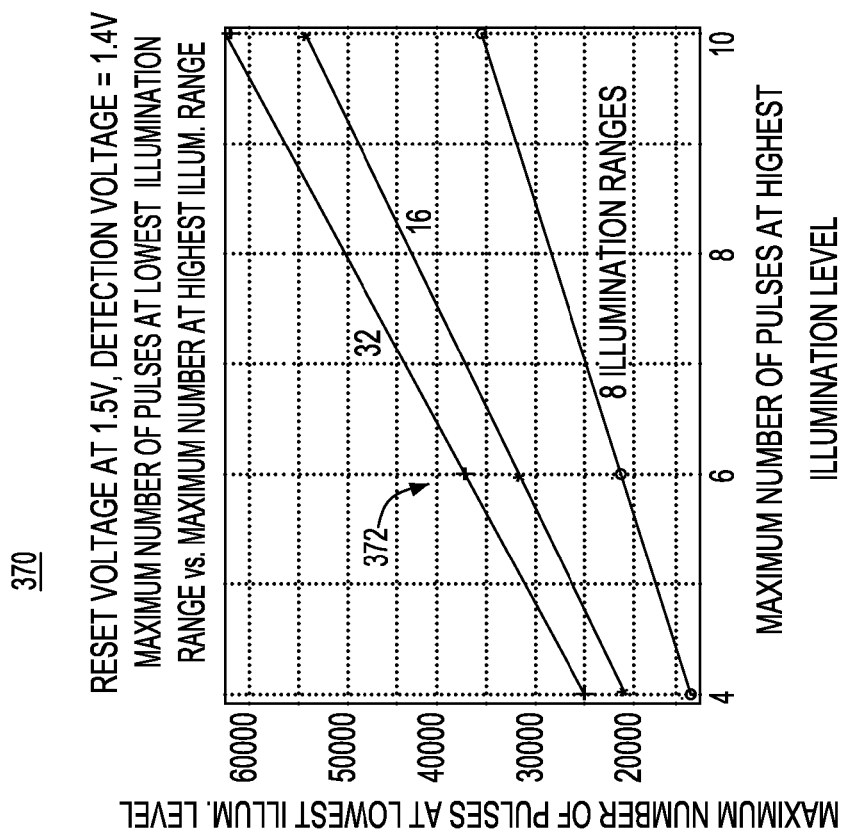
FIG. 21 shows an example plot 370 showing the relationships 372 between the maximum number of pulses at the lowest illumination range versus the maximum number of pulses at the highest illumination level for different number of ranges NR.

FIG. 21 shows an example plot 370 showing the relationships 372 between the maximum number of pulses at the lowest illumination range versus the maximum number of pulses at the highest illumination level for different number of ranges NR. FIG. 21 particularly shows that NHRH(RL) increases with increasing NHRH(RH). Additionally FIG. 21 clearly illustrates how the increase in the number of pulses NHRH(RL) is affected by the number of illumination ranges NR. With NHRH(RH) equal to 6 pulses, increasing NR from 8 to 32 ranges, almost double NHRH(RL). Increasing the maximum number of pulses in the ranges with lower illumination levels, will increase the size of the pulse detection circuitry. This behavior has similarities with the observations described herein about FIG. 19 for the maximum magnitude of detection error PDMAX. These results show how the optimization of the sensor design can be made with respect to the size and complexity of the circuits required for pulse detection, providing immunity against noise and reducing the detection error, or distortion, particularly in the range with the highest illumination levels.

The design considerations discussed herein set the stage for determining the optimum configuration of the pixel array and sensor for the pixel design of FIG. 2B implementing the PFET1 output transistor device. As described herein with respect to FIG. 13, the pixel array is configured as XS×YS pixels. All YS pixels share the same pulse detection and processing circuitry but there is XS number of pulse detection/processing circuits. These detection circuits will make an overall significant portion of the total sensor area. Also YS will determine the total pulse detection/processing time. Thus the optimum design should balance the two important considerations: signal processing time for YS and the circuits required for detection and processing, which is determined by XS. An example case utilizing the design approaches herein will yield a design for XS=2500, and YS=250.

From the herein-described design pixel sensor and processing design considerations, an example optimum sensor design with a pixel cell employing the PFET1 output transistor device as shown in FIG. 2B, is as follows:

RESET Voltage, Vd1=1.5V;
Detection Voltage, VDT=1.4V;
Employ well potential to compensate for temperature and Vt variations;
Minimum number of pulses at the highest illumination range, NMIN=3;
Difference between the minimum and maximum number of pulses at the Highest illumination range, NDIF=3;
Maximum number of pulses at the highest illumination range, e.g., [NHRH(RH)]=6;

Number of illumination ranges, NR=16;
Number of Columns in pixel array, XS=2500;
Number of Rows in pixel array, YS=250;
Width of pulses in signal VNT, WN=0.608 μsec;
Pulse Spacing for signal VNT, TN=0.608 μsec;.
Magnitude of error in detection of illumination level<=10%;
Total Area required for pulse detection about 3 mm²; and,
Total signal processing time: under 5 seconds.

Figure 22:
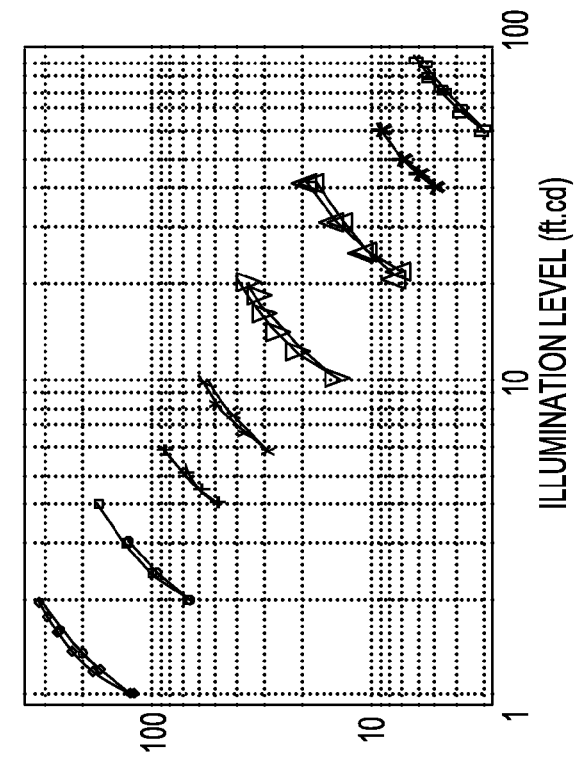
FIG. 22 depicts an example plot 380 showing the relationships 382 between the number of pulses in the first 8 of 16 illumination ranges versus illumination level for the pixel design case of FIG. 2B with PFET1 and, FIG. 23 illustrates the case 390 for the second 8 of the 16 illumination ranges.
Figure 23:
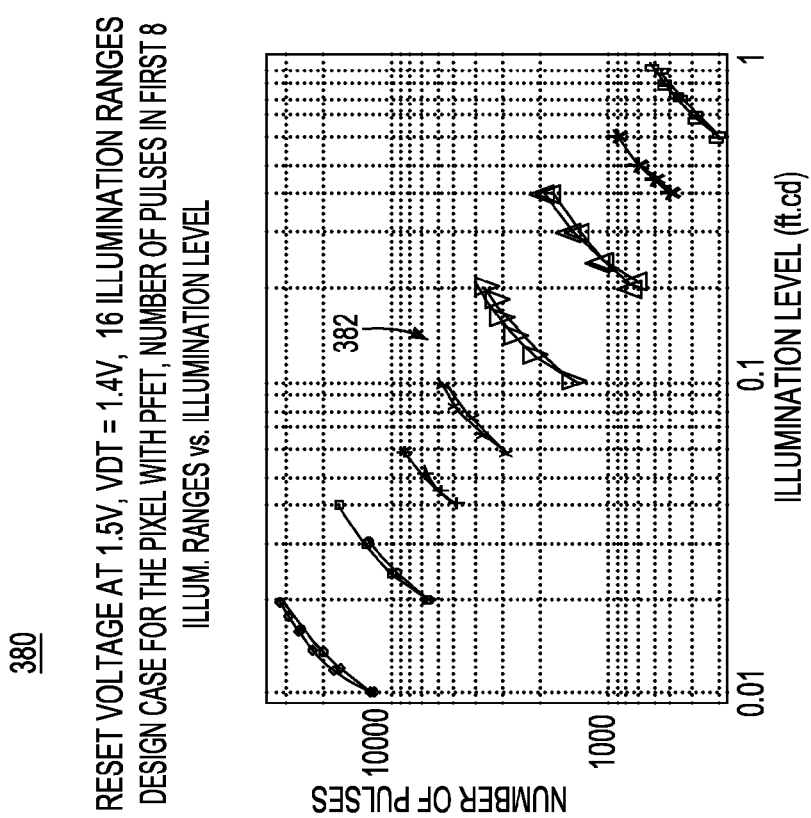

Turning now to the example pixel sensor cell embodiment of FIG. 2A, which is a pixel design without using any PFETs, as previously mentioned, if Vd1 is kept at 1.5V, then the detection voltage which would have to be 1.4V or higher, will require that VT for NFET2 be very high, even with employing a well potential for a triple well design. Thus, for design optimization of the (3) NFET pixel design of FIG. 2A, the RESET voltage Vd1 is reduced to 1.0V, and the detection voltage is reduced to 0.9V. The optimization of all other parameters follow very similarly to the cases considered before for the pixel design with PFET. Thus, from the herein-described design pixel sensor and processing design considerations, one example optimum sensor design utilizing the pixel cell employing the NFET2 output transistor device as shown in FIG. 2A, is as follows:

RESET Voltage, Vd1=1.0V;
Detection Voltage, VDT=0.9V;
Employ well potential to compensate for temperature and Vt variations;
Minimum number of pulses at the highest illumination range, e.g., NMIN=3;
Difference between the minimum and maximum number of pulses at the Highest illumination range, NDIF=3;
Maximum number of pulses at the highest illumination range, e.g., NHRH(RH)=6;
Number of illumination ranges, NR=16;
Number of Columns in pixel array, XS=2500;
Number of Rows in pixel array, YS=250;
Width of pulses in signal VNT, WN=0.83 μsec.;
Pulse Spacing for signal VNT, TN=0.83 μsec;
Magnitude of error in detection of illumination level<=10%;
Total area required for pulse detection=a few mm²; and,
Total signal processing time: about 5 seconds;

It should be understood that the pulse detection/processing time can be further reduced by reducing the number of rows, YS, in each pixel sensor embodiment. FIG. 22 shows an example plot 380 showing the relationships 382 between the number of pulses in the first 8 of 16 illumination ranges versus illumination level for the pixel design case of FIG. 2B with PFET1. FIG. 23 shows the case 390 for the second 8 of the 16 illumination ranges. Note that the total useful illumination range is considered here to be from 0.01 ft.cd to 100 ft.cd. It is understood that in FIGS. 22 and 23 the exact number of pulses are shown by the symbol points exhibiting a non-linear relationship with illumination level on a Log-Log scale. Additionally shown are the design approximate Linear Log-Log relationship with the same power factor for all illumination ranges, and the error due to use of this design criterion being about 10%.

Figure 25:
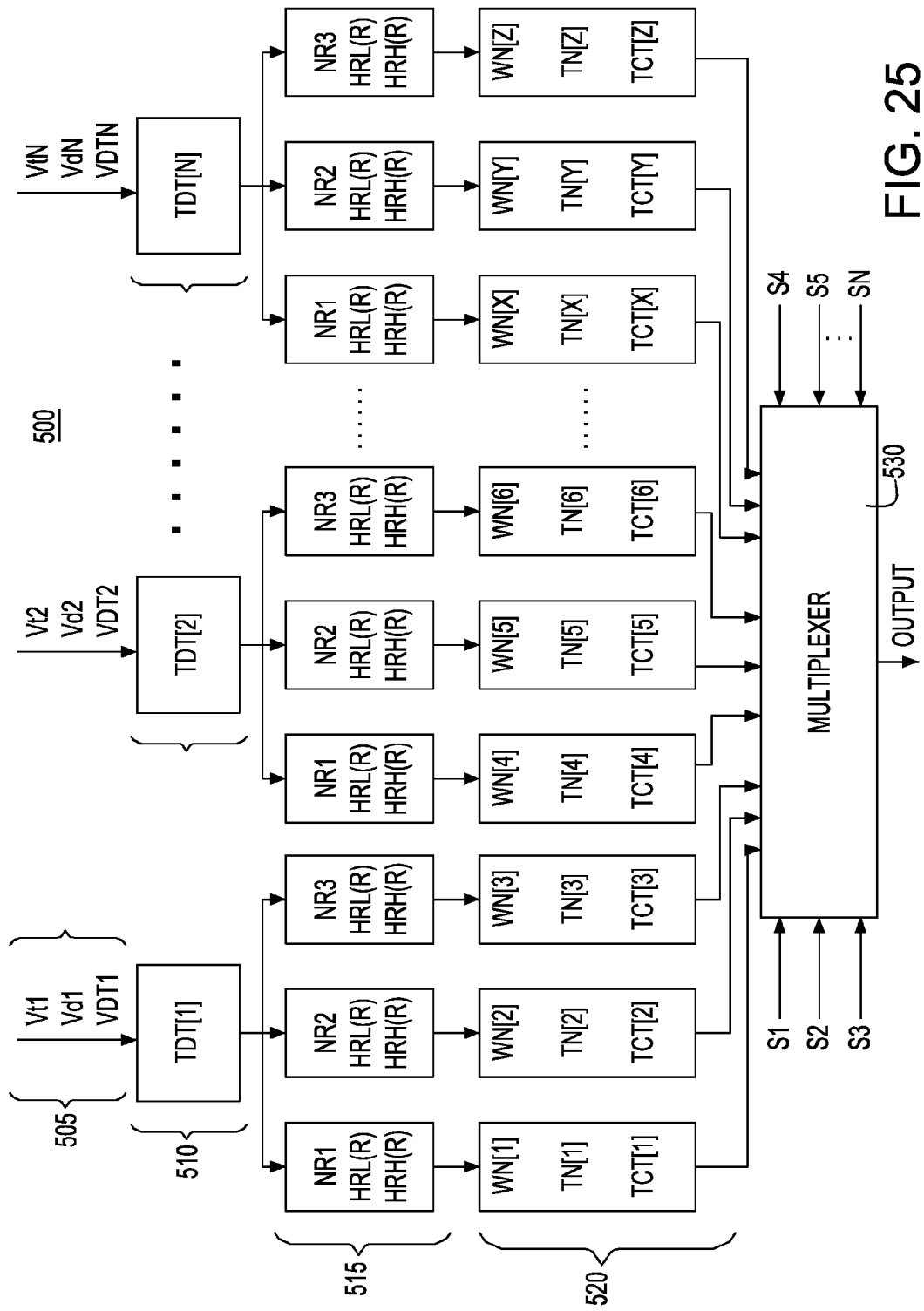
FIG. 25 is a flow chart depiction of a procedure 500 whereby, on a test chip or like apparatus, various circuit configurations are designed to test and characterize many conditions for the design and operation of the CMOS imaging sensor of the present invention; and, FIG. 26 depicts a procedure 550 according to which optimum design or designs of the CMOS imaging sensor can be determined by employing the test chip or like apparatus with which many design configurations are built according to the procedure described with respect to FIG. 25.

FIG. 25 is a flow chart depiction of a procedure 500 whereby, on a test chip or like apparatus, various circuit configurations are designed to test and characterize many conditions for the design and operation of the CMOS imaging sensor as described herein. As shown in FIG. 25, there are three major initial parameters for the pixel design. The three parameters pertain to the operation of the transistors NFET1 and NFET2 for the case of using all nFETs in the sensor pixel cell design as illustrated in FIG. 2A, and the operation of transistors NFET1 and PFET1 for the case of using a pFET in the sensor pixel cell design as illustrated in FIG. 2B. The three major initial design parameters 505 are: Vt which is the threshold voltage of NFET1 or PFET1, VDT which is the detection voltage for NFET2 or PFET2, and Vd1 which is the RESET voltage for NFET1. As shown in the design methodology 500 of FIG. 25, up to n conditions could be selected for the combination of the three major initial design parameters: Vt, VDT and Vd1, each leading to a determination 510 of the detection time (TDT(1), . . . TDT(n)) for the photo diode voltage VPD to reach the detection level for the different voltage conditions. Furthermore, for each of these conditions, as indicated at 515, up to 3 different values could be chosen for the number of illumination ranges NR; however, it is understood that more conditions could be chosen. Furthermore, for each condition of the number of illumination ranges, the choice is made regarding HRL(R) and HRH(R), i.e., the lower and upper illumination levels respectively in each illumination range R. As described herein, and as indicated at step 520, the design parameters WN and TN can then be determined for each design condition, and these values are necessary for the design of the pulse train VNT. Additionally, the respective TCT values that are necessary for the design of the signals VCT can be determined at 520. All the various configurations can then be input to a multiplexer 530 with which, the configurations corresponding to a specific set of design conditions can be selected with the proper configuration of the control signals S1, S2, S3, . . . SN.

Continuing to FIG. 26, there is depicted a procedure 550 according to which optimum design or designs of the CMOS imaging sensor can be determined by employing the test chip or like apparatus with which many design configurations are built according to the procedure shown in FIG. 25. As shown in FIG. 26, at step 555, up to "m" conditions are chosen for the threshold voltage Vt. Thus up to m different pixel designs or configurations could exist on the test chip. Each pixel design is made with specific number of rows and columns, for example: 256 Rows×256 Columns. On the test chip, as shown at step 560, the values for the design parameters are selected. For instance, values 566 may be selected for the Well potential which, in turn, determine the specific condition of detection level VDT that could be selected from the multiplexer 530 of FIG. 25. Similarly, the specific conditions and circuit configurations for NR, VNT and VCT values 567 could be selected one at a time for each pixel design. An illumination light level is selected at 568 and applied on each of the pixel designs as shown in FIG. 26. This light is with a specific illumination level H which is chosen from many values covering the visible range from low to very high illumination levels. Thus, as shown in FIG. 26, the signals VCB1, VCB2, . . . up to VCBm are produced at the output of each pixel. And with the combination of the selected signals: VCB, VCT and VNT 567, the output signals VMT1, VMT2, . . . up to VMTm are produced for each pixel in the various pixel design configurations. These values are applied to each of the counters and comparator circuits at step 570. From this circuitry, the array of output signals V(HS) from all pixels, in each pixel design configuration, i.e., [V(HS)]1, [V(HS)]2, . . . , [V(HS)]m, are produced at each illumination level H as indicated at step 575. All the output data for errors as described herein, including noise and signal variability, are determined at step 580, and finally, the error, noise and signal variability determined at step 580 are compared at 590 for the determination of the optimum choices of pixel design(s) 595.

For the dark current and bright point considerations, the pixel sensor cell design of the present invention provides for a pronounced dark current reduction than in the prior art pixel sensor designs because the detection is based only on Vt for the device and the decay of the voltage as function of illumination level.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

What is claimed is:

1. An CMOS imaging sensor cell, comprising:
 a first FET device adapted to transfer a voltage from a first diffusion region to a second diffusion region, said transferred voltage representing an incident illumination level for a pixel of said sensor cell;
 a second FET device configured as a reset switch, a first terminal of the second FET device coupled to the second diffusion region of the first FET; and
 a third FET device having a gate terminal coupled to the second diffusion region of the first FET device for receiving said transferred voltage, a first terminal of said third FET device coupled to a row select (RS) signal and a second terminal of said third FET device coupled to a column signal line,
 wherein an output signal corresponding to said transferred voltage is generated for output at said column signal line in response to an applied row select signal.

2. The sensor cell as claimed in claim 1, wherein the voltage at the gate terminal of the third FET device is a decreasing function with time with a rate of voltage decay being a function of the incident illumination level at said pixel.

3. The sensor cell as claimed in claim 2, wherein a voltage at the second terminal of the third FET device, coupled to said column signal line, is delayed in time with respect to the application of said RS signal at said first terminal of the third FET device by a time duration which is a function of the incident illumination level and a threshold voltage of said third FET device.

4. The sensor cell as claimed in claim 3, further comprising:
 means for generating a sequence of voltage pulses corresponding to said output signal generated for output at said column signal line, said sequence of voltage pulses adapted for time domain measurement.

5. The sensor cell as claimed in claim 4, wherein said illumination level incident at a pixel is divided into one or more detectable individual illumination ranges (NR), with each individual illumination range (R) having a minimum and maximum pulse sequence number value corresponding to a respective minimum and maximum illumination level for each range,
 wherein said means for generating a sequence of voltage pulses includes a means associated with a respective individual illumination range for generating none or more output pulses (VMT) providing information about the incident illumination level in a respective illumination range of said imaging sensor.

6. The sensor cell as claimed in claim 5, further comprising:
 pulse counter means associated with each illumination range (R) for counting output pulses (VMT) at each range; and,
 a processing device for determining the correct range for illumination and providing an illumination level output signal that is proportional to the light illumination incident at the pixel.

7. The sensor cell as claimed in claim 1, wherein a gate terminal of said second FET device receives a Reset (RST) voltage and a second terminal of said second FET device is coupled to a power supply voltage.

8. The sensor cell as claimed in claim 1, wherein said first diffusion region of the first FET device comprises a diffusion region associated with a photodiode device.

9. The sensor cell as claimed in claim 8, wherein said first FET device comprises a transfer gate for transferring a reset voltage to the photodiode diffusion region of the first FET device when both said transfer gate and the RST voltage is at a first logic level.

10. The sensor cell as claimed in claim 1, wherein said first, second and third FET devices are nFET device devices, at least one nFET comprising a triple N-well structure formed in a substrate.

11. The sensor cell as claimed in claim 1, wherein said first and second FET devices are nFET devices and said third FET device is a pFET device.

12. An imaging sensor apparatus comprising an array of pixel sensor devices, each pixel sensor device of said array comprising:
 three nFET devices,
 a first said nFET device comprising a pixel transfer device having a gate terminal for receiving a transfer signal, a photodiode diffusion region receiving incident light whose illumination level is to be detected, and a collector diffusion region for receiving a voltage level corresponding to incident light received at said photodiode diffusion region,
 a second said nFET device comprising a reset device including a gate terminal for receiving a reset voltage signal, a drain terminal receiving a supply voltage, and including a source terminal connected to the collector diffusion region of the imaging pixel's transfer device; and,
 a third n FET device comprising an output device having a gate terminal connected to the collector diffusion of the transfer device and having a drain terminal coupled to a row select signal input and having a source terminal connected to a column signal line, said output device providing an output signal corresponding to a voltage transferred to said collector diffusion for output at said column signal line in response to application of a row select (RS) signal input.

13. The imaging sensor apparatus as claimed in claim 12, wherein a reset voltage is transferred to the photodiode diffusion of the transfer device upon application of a transfer signal at said transfer device's gate and application of said reset voltage signal at said the reset device.

14. The imaging sensor apparatus as claimed in claim 12, wherein the voltage at the gate terminal of the third nFET device is a decreasing function with time with a rate of voltage decay being a function of the incident illumination level at said photodiode diffusion.

15. The imaging sensor apparatus as claimed in claim 14, wherein an output voltage at the source terminal of the third nFET device, coupled to said column signal line, is delayed in time with respect to the application of said RS signal at said drain terminal of the third nFET device by a time duration which is a function of the incident illumination level and a threshold voltage of said third nFET device.

16. The imaging sensor apparatus as claimed in claim 14, further comprising:
 means for generating a sequence of voltage pulses corresponding to said output signal generated for output at said column signal line, said sequence of voltage pulses adapted for time domain measurement.

17. The imaging sensor apparatus as claimed in claim 16, wherein said incident illumination level is divided into one or more detectable individual illumination ranges (NR), with each individual illumination range (R) having a minimum and maximum pulse sequence number value corresponding to a respective minimum and maximum illumination level for each range.

18. The imaging sensor apparatus as claimed in claim 17, wherein said means for generating a sequence of voltage pulses corresponding to said output signal comprises:
   means for generating pulse train (VNT) having pulses of pre-determined width and period;
   means for generating a series of signals (VCT) associated with each illumination range (R), each VCT signal having a different width (TCT(R)) tuned for an individual illumination range; and,
   logic means associated with each illumination range (R) for receiving said pulse train VNT, said series of signals VCT and said output signal corresponding to said transferred voltage and applying logic to said signals generate said sequence of voltage pulses,
   wherein an output of each said logic means include none or more output pulses (VMT) providing information about the incident illumination level in that respective illumination range of said imaging sensor.

19. The imaging sensor apparatus as claimed in claim 18, further comprising:
   pulse counter means associated with each illumination range (R), each pulse counter means for counting output pulses (VMT) at each range; and,
   a processing device for determining the correct range for illumination and providing an illumination level output signal that is proportional to the light illumination incident at the pixel.

20. The imaging sensor apparatus as claimed in claim 19, wherein said logic means further comprises: means for generating an output signal (VCB) to which logic is applied to generate said sequence of voltage pulses according to: VCB=RS⊕VWB where VWB represents a voltage level of the transferred voltage coupled to the column bus signal line.

21. The imaging sensor apparatus as claimed in claim 18, wherein a duration of each generated sequence of one or more voltage pulses (TCT(R)) is a decreasing function with the maximum illumination level of a particular illumination range (R).

22. The imaging sensor apparatus as claimed in claim 18, wherein said pulses of said pulse train VNT have a predetermined pulse width (WN) and pulse timing (TN) values, said WN and TN values being designed for optimizing a pulse width for each output pulses VMT generated by said sensor.

23. The imaging sensor apparatus as claimed in claim 22, wherein the outputs of each said logic means associated with each illumination range (R) is designed to provide a different number of output pulses, corresponding to the different illumination ranges designed for said sensor.

24. The imaging sensor apparatus as claimed in claim 22, wherein said predetermined pulse width (WN) and timing for VNT pulse train signals is determined according to:

$$WN = [TDTH(RH) - TDTL(RH)]/[2 \times NDIF]$$

where TDTH(RH) corresponds to a time delay for the transferred voltage representing an incident illumination level to reach a detection level for a minimum illumination level of a highest illumination range (RH) and TDTL(RH) corresponds to a time delay for the transferred voltage to reach a detection level for a maximum illumination level of the illumination range RH and, NDIF represents a difference between: a maximum number of pulses detectable in an illumination range (NHRH(RH)) and the minimum number of pulses in the highest illumination range NMIN (RH).

25. The imaging sensor apparatus as claimed in claim 23, wherein the number of pulses and the illumination level for each illumination range is a power law relationship, with a power index for the relationship between the number of pulses and illumination level being the same for all illumination levels.

26. The imaging sensor apparatus as claimed in claim 25, wherein a number of pulses in each illumination range is governed according to:

$$NHR(R,H) = C(R) \times H^{SL}$$

where C(R) is a constant that depends upon the illumination range R, H is the illumination level in the range R, and SL is the power index that governs said power law relationship that is the same for all illumination ranges (R).

27. An imaging sensor apparatus comprising a plurality of pixel sensor devices, each pixel sensor device comprising:
   three FET devices,
   a first nFET device comprising a pixel transfer device having a gate terminal for receiving a transfer signal, a photodiode diffusion receiving incident light whose illumination level is to be detected, and a floating diffusion region,
   a second nFET device comprising a reset device including a gate terminal for receiving a reset voltage signal, a drain terminal receiving a supply voltage, and including a source terminal connected to the floating diffusion region of the imaging pixel's transfer device; and,
   a pFET device comprising an output device having a gate terminal connected to the collector diffusion of the transfer device and having a drain terminal coupled to a row select signal input and having a source terminal connected to a column signal line,
   said output device providing an output signal corresponding to a voltage transferred to said collector diffusion for output at said column signal line in response to application of a row select (RS) signal input.

28. The imaging sensor apparatus as claimed in claim 27, wherein the voltage at the gate terminal of the pFET device is a decreasing function with time with a rate of voltage decay being a function of the incident illumination level at said photodiode diffusion.

29. The imaging sensor apparatus as claimed in claim 27, further comprising:
   means for generating a sequence of voltage pulses corresponding to said output signal generated for output at said column signal line, said sequence of voltage pulses adapted for time domain measurement.

30. The imaging sensor apparatus as claimed in claim 29, wherein said illumination level incident at a pixel is divided into one or more detectable individual illumination ranges (NR), with each individual illumination range (R) having a minimum and maximum pulse sequence number value corresponding to a respective minimum and maximum illumination level for each range,
   wherein said means for generating a sequence of voltage pulses includes a means associated with a respective individual illumination range for generating none or more output pulses (VMT) providing information about the incident illumination level in a respective illumination range of said imaging sensor.

31. The imaging sensor apparatus as claimed in claim 29, further comprising:
pulse counter means associated with each illumination range (R) for counting output pulses (VMT) at each range; and,
a processing device for determining the correct range for illumination and providing an illumination level output signal that is proportional to the light illumination incident at the pixel.

32. A method of operating an image sensor apparatus having at least one FET output device adapted to generate an output signal corresponding to a voltage transferred to said output device from a first FET device, wherein said transferred voltage corresponding to incident light received at a diffusion region of a pixel of said first FET device, said method comprising:
generating a sequence of voltage pulses corresponding to said output signal generated for output, said sequence of voltage pulses adapted for time domain measurement,
counting, via a pulse counter, said sequence of voltage pulses; and,
determining an illumination level for said incident light received at said pixel based on said count.

33. The method as claimed in claim 32, further comprising:
providing an illumination level output signal that is proportional to the light illumination incident at the pixel.

34. The method as claimed in claim 32, wherein for each pixel of said image sensor apparatus, adapted for characterizing an incident pixel illumination as being within one or more different illumination ranges within which said generated output signal may lie, said method further comprising:
generating a plurality of voltage pulse sequences based on said generated output signal, one voltage pulse sequence corresponding to each illumination range, wherein each generated voltage pulse sequence comprises a different numbers of pulses corresponding to the different illumination ranges for the image sensor, and,
providing a pulse counter circuit corresponding to each illumination range for counting each corresponding one voltage pulse sequence,
wherein an incident illumination level is determined based on the number of pulses counted.

35. A method for optimizing a design of an image sensor apparatus comprising an array of pixels, said design method comprising:
a) providing a pixel design apparatus comprising an array of pixels, wherein each pixel of each array comprises:
at least one FET output device adapted to generate an output signal corresponding to a voltage transferred to said output device from a first FET device, wherein said transferred voltage corresponds to incident light received at a diffusion region of said first FET device; and,
a means for generating a sequence of pulses corresponding to said generated output signal, said sequence of pulses adapted for time domain measurement;
b) selecting a plurality of circuit design parameters for pixels of said pixel design apparatus and circuit design parameters for logic circuits comprising said pulse sequence generating means;
c) applying an incident light level for pixels of a pixel design set, said pulse generating means outputting a measurable pulse train indicative of said incident light illumination level applied at each pixel of pixel design set,
d) determining characteristics of each said output pulse train at said applied incident light illumination level and recording said characteristics;
e) repeating steps b)-d) while varying one or more said circuit design parameters for pixels of said design set and recording output pulse train values at varying light illumination levels; and
f) optimizing said plurality of circuit design parameters for pixels of said pixel design apparatus and circuit design parameters for corresponding said pulse generating means according to an recorded output pulse train values providing an optimum response at said pixels.

36. The method for optimizing a design of an image sensor apparatus as claimed in claim 35, wherein said optimizing of said plurality of circuit design parameters for pixels of said pixel includes: comparing said recorded characteristics of said output pulse train for pixels generated at said applied incident light illumination level with recorded characteristics of said output pulse train for pixels generated at said applied incident light illumination level having a varied circuit design parameter.

37. The method for optimizing a design of an image sensor apparatus as claimed in claim 36, wherein said plurality of circuit design parameters for pixels of said pixel design set comprise one or more of: a threshold voltage value of Vt for said FET output device, a voltage well condition for said output FET device to configure a specific detection level for detecting a photovoltage-decay corresponding to said applied incident light illumination level; and, a reset voltage value Vd1 for a reset FET transistor implemented for each pixel.

38. The method for optimizing a design of an image sensor apparatus as claimed in claim 36, wherein said plurality of circuit design parameters for said pulse generating means associated with each pixel of said pixel design set comprise one or more of: a number of illumination ranges in which output pulses are to be generated in each pixel, a minimum number of output pulses for a highest illumination range, a difference between the minimum and maximum number of output pulses for said highest illumination range, a minimum and maximum light illumination level for each illumination range, and, a minimum and maximum number of output pulses for each illumination range.

39. The method for optimizing a design of an image sensor apparatus as claimed in claim 36, wherein said recorded characteristics for said output pulse train generated at each pixel include: signal measurements associated with each said output pulse train generated for at light illumination level applied including error data associated with noise and signal variablility.

* * * * *